(12) United States Patent
Wolk et al.

(10) Patent No.: US 8,469,551 B2
(45) Date of Patent: Jun. 25, 2013

(54) LIGHT EXTRACTION FILMS FOR INCREASING PIXELATED OLED OUTPUT WITH REDUCED BLUR

(75) Inventors: Martin B. Wolk, Woodbury, MN (US); Sergey Lamansky, Apple Valley, MN (US); David S. Thompson, West Lakeland, MN (US); Zhaohui Yang, North Oaks, MN (US); Jun-Ying Zhang, Woodbury, MN (US); Encai Hao, Woodbury, MN (US); William Blake Kolb, West Lakeland, MN (US); Audrey A. Sherman, Saint Paul, MN (US); Kevin R. Schaffer, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 75 days.

(21) Appl. No.: 12/908,804

(22) Filed: Oct. 20, 2010

(65) Prior Publication Data

US 2012/0099323 A1 Apr. 26, 2012

(51) Int. Cl.
*F21V 3/00* (2006.01)
*F21V 5/00* (2006.01)

(52) U.S. Cl.
USPC ............ 362/311.02; 362/311.01; 362/311.03; 362/257; 362/317; 362/351; 362/360; 313/112; 313/504; 313/506; 313/512

(58) Field of Classification Search
USPC .................. 313/112, 504, 506, 512; 362/257, 362/317, 351, 311.01, 311.02, 311.03, 360
See application file for complete search history.

(56) References Cited

U.S. PATENT DOCUMENTS

| | | | |
|---|---|---|---|
| 2,801,185 A | 7/1957 | Iler | |
| 3,213,753 A | 10/1965 | Rogers | |
| 4,379,201 A | 4/1983 | Heilmann et al. | |
| 4,522,958 A | 6/1985 | Das et al. | |

(Continued)

FOREIGN PATENT DOCUMENTS

| | | |
|---|---|---|
| JP | 2005-266293 | 9/2005 |
| WO | WO 2006/026743 | 3/2006 |

(Continued)

OTHER PUBLICATIONS

Lu et al., "Optimization of external coupling and light emission in organic light-emitting devices: modeling and experiment", J. Appl. Phys. 91 (Jan. 15, 2002), pp. 595-604).

(Continued)

*Primary Examiner* — Nimeshkumar Patel
*Assistant Examiner* — Thomas A Hollweg

(57) ABSTRACT

Optical films for enhancing light extraction from self-emissive pixelated OLEDs, without introducing significant pixel blur, are disclosed. The extraction films include a flexible carrier film, and a first and second layer carried by the carrier film. The first layer has a nanovoided morphology, includes a polymer binder, and may have a refractive index less than 1.35 or 1.3. An embedded structured surface of light extraction elements is formed between the first and second layers. The extraction film includes a major coupling surface for attachment to an outer surface of the light source. The film is configured such that a land portion between the structured surface and the major coupling surface is thinner than a specified amount, e.g., less than 50, 25, or 10 microns, or less than a thickness of the carrier film.

30 Claims, 12 Drawing Sheets

U.S. PATENT DOCUMENTS

| | | | |
|---|---|---|---|
| 4,737,559 A | 4/1988 | Kellen et al. | |
| 5,440,446 A | 8/1995 | Shaw et al. | |
| 5,877,895 A | 3/1999 | Shaw et al. | |
| 6,010,751 A | 1/2000 | Shaw et al. | |
| 6,285,001 B1 | 9/2001 | Fleming et al. | |
| 6,686,676 B2* | 2/2004 | McNulty et al. | 313/112 |
| 6,890,642 B2* | 5/2005 | Kaminsky et al. | 428/319.3 |
| 6,965,197 B2* | 11/2005 | Tyan et al. | 313/506 |
| 6,985,275 B2* | 1/2006 | Miyazawa | 359/245 |
| 6,998,775 B2* | 2/2006 | Sugiura et al. | 313/512 |
| 7,018,713 B2 | 3/2006 | Padiyath et al. | |
| 7,094,122 B2 | 8/2006 | Toguchi et al. | |
| 7,098,590 B2 | 8/2006 | Lim et al. | |
| 7,122,845 B2 | 10/2006 | Uchida | |
| 7,165,959 B2 | 1/2007 | Humlicek et al. | |
| 7,210,836 B2 | 5/2007 | Sasagawa | |
| 7,224,529 B2 | 5/2007 | King et al. | |
| 7,247,394 B2 | 7/2007 | Hatwar et al. | |
| 7,301,274 B2* | 11/2007 | Tanaka et al. | 313/504 |
| 7,355,211 B2* | 4/2008 | Tanaka et al. | 257/98 |
| 7,420,739 B2* | 9/2008 | Kim et al. | 359/599 |
| 7,547,476 B2 | 6/2009 | Jones et al. | |
| 7,589,461 B2 | 9/2009 | Park et al. | |
| 7,602,117 B2 | 10/2009 | Yamada et al. | |
| 7,604,916 B2* | 10/2009 | Wolk et al. | 430/200 |
| 7,759,042 B2* | 7/2010 | Wolk et al. | 430/200 |
| 7,830,082 B2* | 11/2010 | Tanaka et al. | 313/504 |
| 7,830,086 B2* | 11/2010 | Adachi et al. | 313/506 |
| 7,872,414 B2* | 1/2011 | Sugita et al. | 313/506 |
| 2001/0035713 A1* | 11/2001 | Kimura | 313/501 |
| 2003/0116719 A1* | 6/2003 | Miyazawa | 250/484.2 |
| 2004/0066556 A1* | 4/2004 | Dontula et al. | 359/599 |
| 2004/0104672 A1* | 6/2004 | Shiang et al. | 313/506 |
| 2004/0217702 A1* | 11/2004 | Garner et al. | 313/512 |
| 2004/0253427 A1* | 12/2004 | Yokogawa et al. | 428/212 |
| 2005/0007000 A1* | 1/2005 | Chou et al. | 313/116 |
| 2005/0052750 A1 | 3/2005 | King et al. | |
| 2005/0116625 A1* | 6/2005 | Park et al. | 313/504 |
| 2005/0156520 A1* | 7/2005 | Tanaka et al. | 313/512 |
| 2005/0185279 A1 | 8/2005 | Mullen et al. | |
| 2005/0194896 A1* | 9/2005 | Sugita et al. | 313/506 |
| 2005/0231106 A1* | 10/2005 | Tanaka et al. | 313/506 |
| 2006/0209404 A1* | 9/2006 | Kim et al. | 359/453 |
| 2006/0219676 A1 | 10/2006 | Taylor et al. | |
| 2007/0262708 A1* | 11/2007 | Tanaka et al. | 313/504 |
| 2008/0084519 A1 | 4/2008 | Brigham et al. | |
| 2008/0107993 A1* | 5/2008 | Wolk et al. | 430/200 |
| 2009/0015142 A1 | 1/2009 | Potts et al. | |
| 2009/0015757 A1 | 1/2009 | Potts et al. | |
| 2009/0257324 A1 | 10/2009 | Seigler | |
| 2009/0316058 A1 | 12/2009 | Huizinga et al. | |
| 2009/0322219 A1* | 12/2009 | Wolk et al. | 313/504 |
| 2010/0110551 A1 | 5/2010 | Lamansky et al. | |
| 2010/0140654 A1* | 6/2010 | Hatsuda et al. | 257/99 |
| 2010/0150513 A1 | 6/2010 | Zhang et al. | |
| 2010/0165276 A1* | 7/2010 | David et al. | 349/122 |

FOREIGN PATENT DOCUMENTS

| | | |
|---|---|---|
| WO | WO 2010/120422 | 10/2010 |
| WO | WO 2010/120468 | 10/2010 |
| WO | WO 2010/120845 | 10/2010 |
| WO | WO 2010/120864 | 10/2010 |
| WO | WO 2010/120871 | 10/2010 |
| WO | WO 2010/120971 | 10/2010 |
| WO | WO 2010/121019 | 10/2010 |

OTHER PUBLICATIONS

U.S. Appl. No. 12/643,503, "Optical Films Enabling Autostereoscopy", filed Dec. 21, 2009.

U.S. Appl. No. 61/359,634, "Lighting Assembly Having Viscoelastic Lightguide", filed Jun. 29, 2010.

U.S. Appl. No. 61/294,610, "Microstructured Low Refractive Index Viscoelastic Articles", filed Jan. 13, 2010.

U.S. Appl. No. 61/294,600, "Microstructured Low Refractive Index Articles", filed Jan. 13, 2010.

U.S. Appl. No. 61/294,577, "Microstructured Low Refractive Index Article Process", filed Jan. 13, 2010.

U.S. Appl. No. 61/303,152, "Optical Device Having Lightguide and Nanovoided Polymeric Layer", filed Feb. 10, 2010.

* cited by examiner

LIGHT EXTRACTION FILMS FOR INCREASING PIXELATED OLED OUTPUT WITH REDUCED BLUR

FIELD OF THE INVENTION

This invention relates generally to optical films having structured surfaces tailored to couple light out of solid state self-emissive lighting devices to increase the brightness thereof, with particular application to self-emissive lighting devices known as organic light emitting devices (OLEDs) (sometimes also referred to as organic light emitting diodes). The invention also pertains to related articles, systems, and methods.

BACKGROUND

A wide variety of OLEDs are known. Some OLEDs, referred to as "bottom emitting" OLEDS, emit light through a transparent substrate on which the OLED is fabricated. Others, referred to as "top emitting" OLEDs, emit light in the opposite direction, i.e., away from the substrate on which the OLED is fabricated. Some OLEDs are patterned to form an array of individually addressable OLED emitters, referred to individually as pixels (picture elements) or subpixels (one of several neighboring emitters of different colors that are grouped together as a pixel but are individually addressable). Such pixelated OLEDs are becoming increasingly popular for use in digital display devices such as for mobile phones and similar end uses. In contrast to pixelated OLEDs, other OLEDs are designed to have only one emitting area, which may be small and narrow or large and extended depending on the intended application.

One issue of concern to some OLED manufacturers and designers is the less-than-ideal efficiencies exhibited by OLEDs due to peculiarities of their design. The external efficiency of an OLED, or of any other self-emissive light source, can be calculated as the power of all optical radiation emitted by the device divided by the total electrical power consumed by the device. OLED external efficiency is a significant design parameter for many different OLED applications, ranging for example from pixelated OLEDs used in high-resolution displays to non-pixelated OLEDs used in lighting systems, since the external efficiency affects such device characteristics as power consumption, luminance, and lifetime. A number of groups have demonstrated that OLED external efficiency is significantly limited by optical losses within the active emitting layers of the OLED stack itself (due to waveguiding modes within high refractive index organic layers and indium tin oxide), within intermediate-refractive index substrates, and finally due to exciton quenching at the cathode (anode) metal's surface plasmon polaritons. In an OLED device that exhibits the maximum possible internal efficiency (i.e., 100% internal efficiency), about 75-80% of the generated optical radiation is dissipated internally due to the above-mentioned losses, resulting in a corresponding reduction in external efficiency. If additional optical components such as color filters or circular polarizers are included as elements of the OLED device, such components can produce additional optical losses and even lower external efficiencies.

Some optical films have already been proposed to enhance light extraction from OLED devices. Reference in this regard is made to U.S. Patent Application Publications US 2009/0015142 (Potts et al.), US 2009/0015757 (Potts et al.), and US 2010/0110551 (Lamansky et al.), which are incorporated herein by reference in their entireties.

BRIEF SUMMARY

We have developed a new family of optical films that can be used in combination with OLEDs and other self-emissive light sources to extract light from such devices so as to increase the emitted light and reduce losses. The disclosed optical extraction films are particularly effective in combination with pixelated OLEDs.

The disclosed optical films are useful for enhancing light extraction from self-emissive pixelated OLEDs, without introducing significant pixel blur. The extraction films typically include a flexible carrier film, and a first and second layer carried by the carrier film. The first layer may have a nanovoided morphology and may include a polymer binder, and may also have a refractive index less than 1.35 or 1.3. An embedded structured surface of light extraction elements is formed between the first and second layers. The extraction film includes a major coupling surface for attachment to an outer surface of the light source. The film is preferably configured such that a land portion between the structured surface and the major coupling surface is thinner than a specified amount, e.g., less than 50, 25, or 10 microns, or less than a thickness of the carrier film.

The present application also discloses, inter alia, optical extraction films for enhancing light extraction from a self-emissive pixelated light source that has an outer surface, the extraction film having a major coupling surface adapted to attach to the outer surface of the light source. Such extraction films include a flexible carrier film, and a first and second layer carried by the carrier film. The first and second layers may define therebetween an embedded interface that forms a structured surface of light extraction elements, and the first layer may have a nanovoided morphology and may comprise a polymer binder. The first layer may also be disposed between the second layer and the carrier film. The second layer has a refractive index greater than that of the first layer, and the first layer may have a refractive index less than 1.35.

In some cases, the major coupling surface may be a surface of the second layer opposite the structured surface, and the second layer may include a land portion between the structured surface and the major coupling surface. In some cases, the land portion may have a thickness less than 50, or 25, or 10 micrometers, or in a range from 0.1 to 25 micrometers. In some cases, the land portion may be thinner than the carrier film. In some cases, the first layer may have a refractive index less than 1.3. In some cases, the second layer may have a refractive index greater than 1.4. In some cases, a refractive index difference between the first and second layers may be at least 0.3, or at least 0.4, or at least 0.5. In some cases, the second layer may comprise a light transmissive polymer. In some cases, the polymer may comprise a light transmissive viscoelastic material. In some cases, the film may further include a release liner or premask covering the major coupling surface. In some cases, the light extraction elements may have a pitch greater than 1 micron.

In some cases, the extraction film may be combined with the self-emissive pixelated light source, wherein the light extraction film couples to the self-emissive pixelated light source to enhance light extraction therefrom. In some cases, the extraction film may attach to the outer surface of the light source with no air gap therebetween. In some cases, the structured surface may be separated from the major coupling surface by a land portion having a thickness less than 50, or 25, or 10 micrometers, or in a range from 0.1 to 25 micrometers. In some cases, the self-emissive pixelated light source may include an optical coupling layer that planarizes the pixelated light source, and wherein the outer surface of the light source is an outer surface of the optical coupling layer. In some cases, the optical coupling layer may have a refractive index of at least 1.4, or 1.5, or 1.6, or 1.7. In some cases, the pixelated light source may comprise pixels that have at least one transverse dimension of less than 25 microns. In some cases, the light extraction elements may have a pitch greater than 1 micron.

We also disclose methods of enhancing the light output of a self-emissive pixelated light source without substantially blurring pixels of the light source. The methods may include providing a self-emissive pixelated light source having an outer surface, providing an optical extraction film having a major coupling surface, and attaching the major coupling surface of the extraction film to the outer surface of the self-emissive pixelated light source. The optical extraction film of such methods may include a flexible carrier film, and a first and second layer carried by the carrier film, the first and second layers defining therebetween an embedded interface that forms a structured surface of light extraction elements. The first layer may have a nanovoided morphology and comprise a polymer binder, and may also have a refractive index less than 1.35 and less than that of the second layer.

In some cases, the self-emissive pixelated light source may include an optical coupling layer that planarizes the pixelated light source, and the outer surface of the light source may be an outer surface of the optical coupling layer. In some cases, the attaching is carried out such that a land portion is defined between the structured surface of the optical extraction film and the outer surface of the light source. In some cases, the land portion has a thickness less than 50 microns. In some cases, the land portion may have a thickness less than 25 microns. In some cases, the land portion may have a thickness less than 10 microns. In some cases, the land portion may be thinner than the carrier film.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION OF ILLUSTRATIVE EMBODIMENTS

Figure 1:
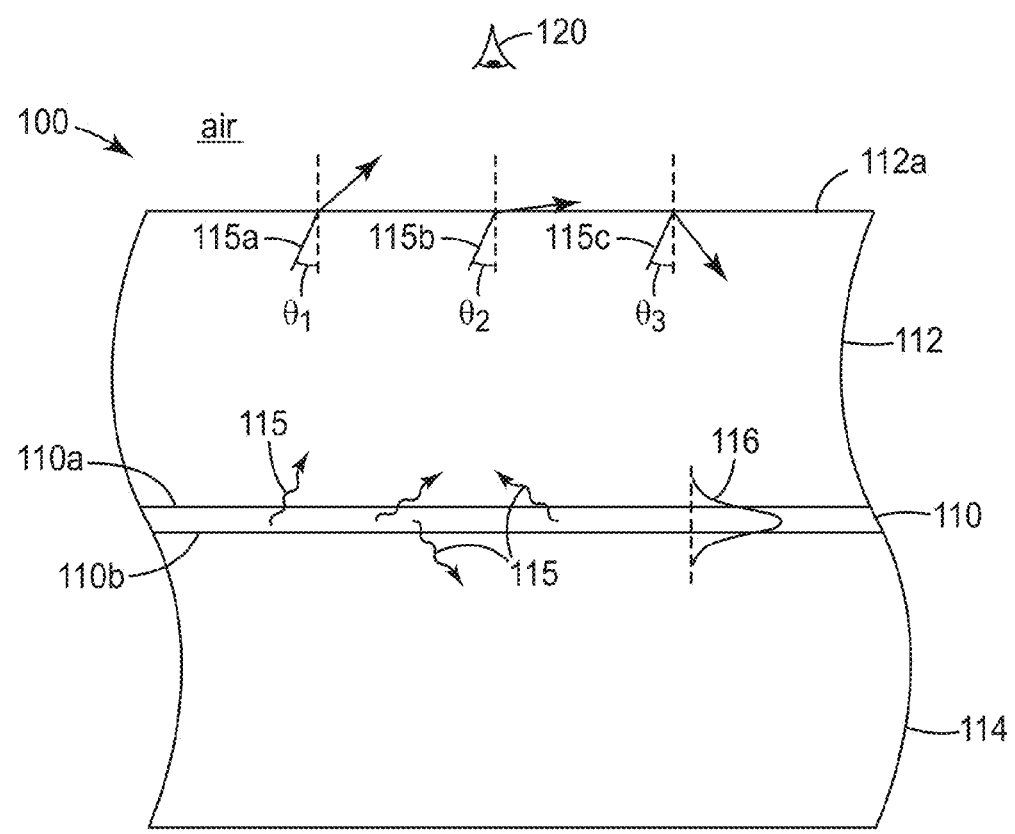
FIG. 1 is a schematic side or cross-sectional view of generalized OLED light source.

FIG. 1 depicts in an oversimplified schematic fashion a portion of one embodiment of an OLED 100. The OLED 100, which may be either a bottom-emitting or a top-emitting OLED, includes a thin emitting region 110 sandwiched between two optically thick layers 112, 114. The layers 112, 114 may serve as barrier layers to keep water vapor and oxygen away from the emitting region 110, and one of the layers 112, 114 may serve as a substrate upon which the other components of the OLED 100 are grown, deposited, or laminated. In alternative embodiments one of the thick layers 112, 114 may be omitted or replaced with an inert gas or vacuum. The emitting region 110 may include one or more conventional organic layers tailored to emit light of a desired wavelength in response to an applied electric current or field. The applied electric current may be supplied by electrodes whose major surfaces may coincide with the outer surfaces 110a, 110b of the emitting region. At least one electrode, e.g., the one disposed at surface 110a, is transparent. The electrodes and organic emitting layer(s) are typically made of materials whose refractive indices are substantially greater than about 1.5. For example, a transparent electrode made of indium tin oxide (ITO) has a refractive index of about 1.8, and typical light-emissive organic materials may have a refractive index in a range from 1.6 to 1.8. Besides having a relatively high refractive index, the emitting region is also typically very thin, e.g., on the order of a wavelength of visible light or less. For example, an ITO electrode layer may have a thickness on the order of about 150 nm, and an emissive organic layer may have a thickness on the order of about 100 nm, although of course other thicknesses may be used.

In contrast to the emitting region, the layers 112, 114 are not only optically thick, i.e., have thicknesses substantially greater than a wavelength of visible light, but they also have refractive indices that are less than those of the emitting region 110. For example, the layers 112, 114 may comprise glass or plastic whose refractive index is on the order of 1.5. As a result, the thin emitting region 110 can trap some of the light emitted by the organic material in one or more waveguiding modes, depicted generally in FIG. 1 as a waveguiding electromagnetic field 116. When electric current is applied to energize the organic material in the emitting region 110, light is emitted in all directions. Some of this light, represented by light rays 115, propagates in directions that allow the light to refract into the layer 112 or 114 and escape the emitting region 110. Another portion of the emitted light becomes trapped in the high refractive index region 110, propagating along that region as one or more waveguiding modes represented by field 116. The field 116 typically has a field strength that decays exponentially as a function of distance from the boundaries or surfaces 110a, 110b, the details of the decay depending on factors such as the refractive index difference between the region 110 and the adjacent optically thick layer 112 or 114, as well as the particular waveguiding mode if more than one mode is supported. The exponentially decaying portion of the field 116 outside of the region 110 is referred to as an evanescent wave. In most practical cases, the evanescent wave can be considered to be present within only a very short distance of the emitting region 110, e.g., in a boundary region of layer 112 or 114 adjacent the corresponding outer surface of region 110 and whose thickness may be on the order of a wavelength of visible light, e.g., on the order of 1 micrometer or less, or may be somewhat greater if the optically thick layer has a refractive index that is closer to that of the high refractive index region.

Of the light 115 that escapes the emitting region 110, some of that light travels along directions that deviate from the thickness axis or optical axis of the OLED 110 by angles that are small enough so that the light is refracted out of the layer 112. Such light is thus able to escape the OLED 100 into the surrounding air medium (note that the "air" medium of FIG. 1 may refer to any one of standard atmospheric air, or vacuum, or a suitable inert gas) and eventually reach an observer 120 or other optical component. Light rays 115a and 115b are exemplary of this escaping light. Ray 115a strikes the air interface at outer surface 112a at an angle $\theta_1$, which angle is small enough so that the light is refracted out of the OLED device and into the surrounding air medium. Ray 115b strikes the air interface at an angle $\theta_2$, which is greater than $\theta_1$ and close to the critical angle for layer 112 but still slightly smaller than the critical angle, such that the refracted light exits into the surrounding air medium at a near-glancing angle. If we follow this progression to light ray 115c, we see that some of the light 115 that escapes the emitting region 110 travels along directions that deviate from the thickness or optical axis of the OLED 100 by angles that are too large to be refracted out of the layer 112. Thus, light ray 115c strikes the air interface at an angle $\theta_3$ that is greater than the critical angle for layer 112, thus causing the ray 115c to be totally internally reflected at the surface 112 and trapped within the OLED 100.

We thus see that light can be trapped within the OLED device 100 in one of two ways: in a waveguiding mode associated with emitting region 110, and by total internal reflection (TIR) at an air interface 112a of the device. In both cases, the trapped light is typically eventually absorbed, and results in reduced brightness, reduced efficiency, and increased losses for the OLED 100. We refer to losses associated with light trapped in the emitting region as waveguide losses, and losses associated with light trapped by TIR at the outer surface of the OLED as substrate losses. Further discussion of loss mechanisms in OLEDs can be found in Lu et al., "Optimization of external coupling and light emission in organic light-emitting devices: modeling and experiment", 91 J. Appl. Phys. (Jan. 15, 2002), pp. 595-604.

Nanovoided Layers

Exemplary optical extraction films disclosed herein incorporate at least one nanovoided layer. The nanovoided layer may include a plurality of interconnected voids or a network of voids dispersed in a binder. At least some of the voids in the plurality or network are connected to one another via hollow tunnels or hollow tunnel-like passages. The voids preferably occupy a sufficiently large fraction of the volume of the layer, but are individually of a small enough size, so that the nanovoided layer behaves optically like a material of very low refractive index, e.g., less than 1.35 or less than 1.3. Such a layer is particularly advantageous for use in an optical extraction film as demonstrated more fully below. In some cases, the nanovoided layer may exhibit a refractive index in a range from 1.15 to 1.35, or from 1.15 to 1.3, for example. The nanovoided layer preferably has at least one major surface that is microstructured, i.e., deliberately tailored to have a non-smooth or non-flat surface with relief features that have at least one dimension that is less than 1 millimeter, and in some cases the at least one dimension may be in a range from 50 nanometers to 500 micrometers, or from 50 nanometers to 100 microns, or from 50 nanometers to 1 micron.

Figure 2:
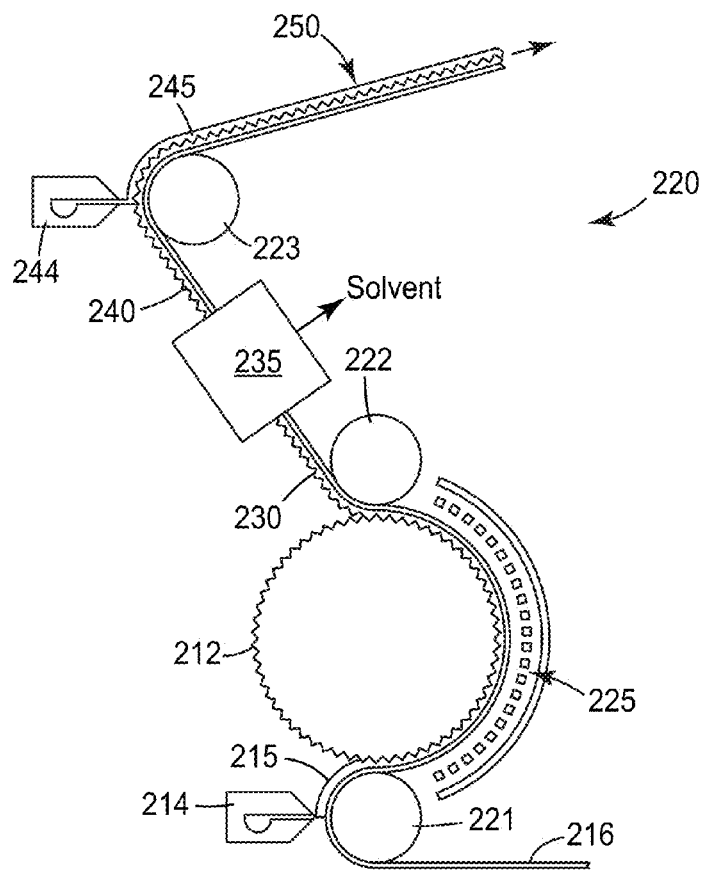
FIG. 2 is a schematic diagram of an illustrative process of forming a backfilled nanovoided microstructured article.
Figure 3:
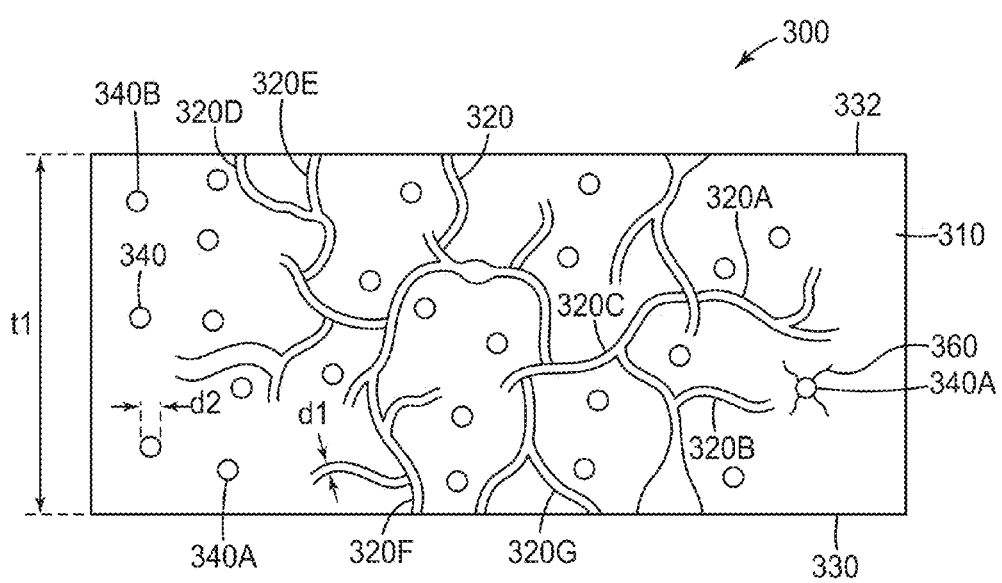
FIG. 3 is a schematic side elevational view of a portion of a nanovoided microstructured layer.

In connection with FIGS. 2 and 3, we describe exemplary methods of fabricating a nanovoided layer, as well as features and characteristics that such layers may exhibit. Further details regarding suitable nanovoided layers and their manufacture can be found in commonly assigned U.S. provisional patent application 61/405,128 entitled "Optical Films With Microstructured Low Refractive Index Nanovoided Layers and Methods Therefor", filed Oct. 20, 2010, and incorporated herein by reference in its entirety.

Turning first to FIG. 2, we see there an exemplary process 220 of forming a backfilled nanovoided microstructured article 250, and a corresponding system for manufacturing such articles. The process 220 includes disposing a coating solution 215 onto a substrate 216. The substrate 216 is preferably a flexible film made of a polymer and/or other suitable material, the film having a thickness, composition, and other physical characteristics that make it suitable for use as a free-standing support film or carrier film in roll-to-roll processing systems such as that depicted in FIG. 2. Typically, such a substrate or carrier film, if made with a conventional light-transmissive polymer material, has a physical thickness of at least 0.002 inches (about 50 micrometers) in order to have sufficient strength to be unwound, processed in the roll-to-roll processing system, and wound up again or subjected to one or more converting operations (such as slitting or singulating into individual sheets or pieces) without excessive unintended stretching, curling, or warping.

In some cases the coating solution 215 may be applied using a die 214 such as a slot coater die for example. The coating solution 215 includes a polymerizable material and a solvent. Then the process 220 includes polymerizing the polymerizable material while the coating solution 215 is in contact with a microreplication tool 212 to form a microstructured layer 230. Solvent is then removed, for example by an oven 235, from the microstructured layer 230 to form a nanovoided microstructured article 240. Then the process 220 includes disposing a polymeric material 245 on the nanovoided microstructured article 240 to form a backfilled nanovoided microstructured article 250. The polymeric material 245 may be applied using a die 244 such as a slot coater die for example, or by other suitable means. The polymeric material 245 may alternatively be laminated onto the nanovoided microstructured article 240 to form the nanovoided microstructured article 250.

The microreplication tool 212 can be any useful microreplication tool. The microreplication tool 212 is illustrated as a roll where the microreplication surface is on the exterior of the roll. It is also contemplated that the microreplication apparatus can include a smooth roll where the microreplication tool is a structured surface of the substrate 216 that contacts the coating solution 215. The illustrated microreplication tool 212 includes a nip roll 221 and a take-away roll 222. A curing source 225, such as a bank of UV lights, is illustrated as being directed toward the substrate 216 and coating solution 215 while the coating solution 215 is in contact with the microreplication tool 212 to form a microstructured layer 230. In some embodiments, the substrate 216 can transmit the curing light to the coating solution 215 to cure the coating solution 215 and form the microstructured layer 230. In other embodiments the curing source 225 is a heat source and the coating solution 215 includes a thermal curing material. The curing source 225 can be disposed either as illustrated or within the microreplication tool 212. When the curing source 225 is disposed within the microreplication tool 212, the microreplication tool 212 can transmit light to the coating solution 215 to cure the coating solution 215 and form the microstructured layer 230.

The processes to form the nanovoided microstructured articles can include additional processing steps such as post-cure or further polymerization steps, for example. In some cases, a post-cure step is applied to the nanovoided microstructured article following the solvent removal step. In some embodiments, these processes can include additional processing equipment common to the production of web-based materials, including, for example, idler rolls, tensioning rolls, steering mechanisms, surface treaters such as corona or flame treaters, lamination rolls, and the like. In some cases, these processes can utilize different web paths, coating techniques, polymerization apparatus, positioning of polymerization apparatus, drying ovens, conditioning sections, and the like, and some of the sections described can be optional. In some cases, one, some, or all steps of the process can be carried out as a "roll-to-roll" process wherein at least one roll of substrate is passed through a substantially continuous process and ends up on another roll or is converted via sheeting, laminating, slitting, or the like.

Turning now to FIG. 3, we see there a schematic elevational view of a portion of a nanovoided microstructured layer 300. Although the nanovoided microstructured layer 300 is illustrated having two planar outer surfaces 330, 332, it is understood that at least one of the outer surfaces 330, 332 is microstructured to form relief or extraction features as discussed further herein.

Exemplary nanovoided microstructured layers 300 include a plurality of interconnected voids or a network of voids 320 dispersed in a binder 310. At least some of the voids in the plurality or network are connected to one another via hollow tunnels or hollow tunnel-like passages. The interconnected voids may be the remnant of an interconnected mass of solvent that formed part of the originally coated film, and that was driven out of the film by the oven or other means after curing of the polymerizable material. The network of voids 320 can be regarded to include interconnected voids or pores 320A-320C as shown in FIG. 3. The voids are not necessarily free of all matter and/or particulates. For example, in some cases, a void may include one or more small fiber- or string-like objects that include, for example, a binder and/or nanoparticles. Some disclosed nanovoided microstructured layers may include multiple sets of interconnected voids or multiple networks of voids where the voids in each set or network are interconnected. In some cases, in addition to multiple pluralities or sets of interconnected voids, the nanovoided microstructured layer may also include a plurality of closed or unconnected voids, meaning that the voids are not connected to other voids via tunnels. In cases where a network of voids 320 forms one or more passages that extend from a first major surface 330 to an opposed second major surface 332 of the nanovoided layer 300, the layer 300 may be described as being a porous layer.

Some of the voids can reside at or interrupt a surface of the nanovoided microstructured layer and can be considered to be surface voids. For example, in the exemplary nanovoided microstructured layer 300, voids 320D and 320E reside at second major surface 332 of the nanovoided microstructured layer and can be regarded as surface voids 320D and 320E, and voids 320F and 320G reside at first major surface 330 of the nanovoided microstructured layer and can be regarded as surface voids 320F and 320G. Some of the voids, such as voids 320B and 320C, are disposed within the interior of the optical film and away from the exterior surfaces of the optical film, and can thus be regarded as interior voids 320B and 320C even though an interior void may be connected to a major surface via one or more other voids.

Voids 320 have a size d1 that can generally be controlled by choosing suitable composition and fabrication, such as coating, drying, and curing conditions. In general, d1 can be any desired value in any desired range of values. For example, in some cases, at least a majority of the voids, such as at least 60% or 70% or 80% or 90% or 95% of the voids, have a size that is in a desired range. For example, in some cases, at least a majority of the voids, such as at least 60% or 70% or 80% or 90% or 95% of the voids, have a size that is not greater than about 10 micrometers, or not greater than about 7, or 5, or 4, or 3, or 2, or 1, or 0.7, or 0.5 micrometers. The term "nanovoid" as used herein therefore refers to a void having a size that is not greater than about 10 micrometers, or not greater than about 7, or 5, or 4, or 3, or 2, or 1, or 0.7, or 0.5 micrometers; similarly, the term "nanovoided" as used herein in connection with a layer refers to a voided layer in which at least a majority of the voids are nanovoids.

In some cases, a plurality of interconnected voids 320 has an average void or pore size that is not greater than about 5 micrometers, or not greater than about 4 micrometers, or not greater than about 3 micrometers, or not greater than about 2 micrometers, or not greater than about 1 micrometer, or not greater than about 0.7 micrometers, or not greater than about 0.5 micrometers.

In some cases, some of the voids can be sufficiently small so that their primary optical effect is to reduce the effective refractive index, while some other voids can reduce the effective index and scatter light, while still some other voids can be sufficiently large so that their primary optical effect is to scatter light. In some cases the voids are sufficiently small as to reduce the effective refractive index without appreciably scattering light.

The nanovoided microstructured layer 300 may have any useful thickness t1 (linear distance between first major surface 330 and second major surface 332). In many embodiments the nanovoided microstructured layer may have a thickness t1 that is not less than about 100 nm, or not less than about 500 nm, or not less than about 1,000 nm, or in a range from 0.1 to 10 micrometers, or in a range from 1 to 100 micrometers.

In some cases, the nanovoided microstructured layer may be thick enough so that the nanovoided microstructured layer can reasonably have an effective refractive index that can be expressed in terms of the indices of refraction of the voids and the binder, and the void or pore volume fraction or porosity. In such cases, the thickness of the nanovoided microstructured layer is not less than about 500 nm, or not less than about 1,000 nm, or in a range from 1 to 10 micrometers, or in a range from 500 nm to 100 micrometers, for example.

When the voids in a disclosed nanovoided microstructured layer are sufficiently small and the nanovoided microstructured layer is sufficiently thick, the nanovoided microstructured layer has an effective permittivity $\in_{\mathit{eff}}$ that can be expressed as:

$$\in_{\mathit{eff}} = (f)\in_v + (1-f)\in_b, \quad (1)$$

where $\in_v$ and $\in_b$ are the permittivities of the voids and the binder respectively, and f is the volume fraction of the voids in the nanovoided microstructured layer. In such cases, the effective refractive index $n_{\mathit{eff}}$ of the nanovoided microstructured layer can be expressed as:

$$n_{\mathit{eff}}^2 = (f)n_v^2 + (1-f)n_b^2, \quad (2)$$

where $n_v$ and $n_b$ are the refractive indices of the voids and the binder respectively. In some cases, such as when the difference between the indices of refraction of the voids and the binder is sufficiently small, the effective index of the nanovoided microstructured layer can be approximated by the following expression:

$$n_{\mathit{eff}} \approx (f)n_v + (1-f)n_b, \quad (3)$$

In such cases, the effective index of the nanovoided microstructured layer is the volume weighted average of the indices of refraction of the voids and the binder. For example, a nanovoided microstructured layer that has a void volume fraction of 50% and a binder that has an index of refraction of 1.5 has an effective index of about 1.25 as calculated by equation (3), and an effective index of about 1.27 as calculated by the more precise equation (2). In some exemplary embodiments the nanovoided microstructured layer may have an effective refractive index in a range from 1.15 to 1.35, or from 1.15 to 1.3, but values outside these ranges are also contemplated.

The nanovoided layer 300 of FIG. 3 is also shown to include, in addition to the plurality of interconnected voids or network of voids 320 dispersed in the binder 310, an optional plurality of nanoparticles 340 dispersed substantially uniformly within the binder 310.

Nanoparticles 340 have a size d2 that can be any desired value in any desired range of values. For example, in some cases at least a majority of the particles, such as at least 60% or 70% or 80% or 90% or 95% of the particles, have a size that is in a desired range. For example, in some cases, at least a majority of the particles, such as at least 60% or 70% or 80% or 90% or 95% of the particles, have a size that is not greater than about 1 micrometer, or not greater than about 700, or 500, or 200, or 100, or 50 nanometers. In some cases, the plurality of nanoparticles 340 may have an average particle size that is not greater than about 1 micrometer, or not greater than about 700, or 500, or 200, or 100, or 50 nanometers.

In some cases, some of the nanoparticles can be sufficiently small so that they primarily affect the effective refractive index, while some other nanoparticles can affect the effective index and scatter light, while still some other particles can be sufficiently large so that their primary optical effect is to scatter light.

The nanoparticles 340 may or may not be functionalized. In some cases, some, most, or substantially all of the nanoparticles 340, such as nanoparticle 340B, are not functionalized. In some cases, some, most, or substantially all of the nanoparticles 340 are functionalized or surface treated so that they can be dispersed in a desired solvent or binder 310 with no, or very little, clumping. In some embodiments, nanoparticles 340 can be further functionalized to chemically bond to binder 310. For example, nanoparticles such as nanoparticle 340A, can be surface modified or surface treated to have reactive functionalities or groups 360 to chemically bond to binder 310. Nanoparticles can be functionalized with multiple chemistries, as desired. In such cases, at least a significant fraction of nanoparticles 340A are chemically bound to the binder. In some cases, nanoparticles 340 do not have reactive functionalities to chemically bond to binder 310. In such cases, nanoparticles 340 can be physically bound to binder 310.

In some cases, some of the nanoparticles have reactive groups and others do not have reactive groups. An ensemble of nanoparticles can include a mixture of sizes, reactive and nonreactive particles, and different types of particles (e.g., silica and zirconium oxide). In some cases, the nanoparticles may include surface treated silica nanoparticles.

The nanoparticles may be inorganic nanoparticles, organic (e.g., polymeric) nanoparticles, or a combination of organic and inorganic nanoparticles. Furthermore, the nanoparticles may be porous particles, hollow particles, solid particles, or combinations thereof. Examples of suitable inorganic nanoparticles include silica and metal oxide nanoparticles including zirconia, titania, ceria, alumina, iron oxide, vanadia, antimony oxide, tin oxide, alumina/silica, and combinations thereof. The nanoparticles can have an average particle diameter less than about 1000 nm, or less than about 100 or 50 nm, or the average may be in a range from about 3 to 50 nm, or from about 3 to 35 nm, or from about 5 to 25 nm. If the nanoparticles are aggregated, the maximum cross sectional dimension of the aggregated particle can be within any of these ranges, and can also be greater than about 100 nm. In some embodiments, "fumed" nanoparticles, such as silica and alumina, with primary size less than about 50 nm, are also included, such as CAB-O-SPERSE® PG 002 fumed silica, CAB-O-SPERSE® 2017A fumed silica, and CAB-O-SPERSE® PG 003 fumed alumina, available from Cabot Co. Boston, Mass.

The nanoparticles may include surface groups selected from the group consisting of hydrophobic groups, hydrophilic groups, and combinations thereof. Alternatively, the nanoparticles may include surface groups derived from an agent selected from the group consisting of a silane, organic acid, organic base, and combinations thereof. In other embodiments, the nanoparticles include organosilyl surface groups derived from an agent selected from the group consisting of alkylsilane, arylsilane, alkoxysilane, and combinations thereof.

The term "surface-modified nanoparticle" refers to a particle that includes surface groups attached to the surface of the particle. The surface groups modify the character of the particle. The terms "particle diameter" and "particle size" refer to the maximum cross-sectional dimension of a particle. If the particle is present in the form of an aggregate, the terms "particle diameter" and "particle size" refer to the maximum cross-sectional dimension of the aggregate. In some cases, particles can be large aspect ratio aggregates of nanoparticles, such as fumed silica particles.

The surface-modified nanoparticles have surface groups that modify the solubility characteristics of the nanoparticles. The surface groups are generally selected to render the particle compatible with the coating solution. In one embodiment, the surface groups can be selected to associate or react with at least one component of the coating solution, to become a chemically bound part of the polymerized network.

A variety of methods are available for modifying the surface of nanoparticles including, e.g., adding a surface modifying agent to nanoparticles (e.g., in the form of a powder or a colloidal dispersion) and allowing the surface modifying agent to react with the nanoparticles. Other useful surface modification processes are described in, e.g., U.S. Pat. No. 2,801,185 (Iler) and U.S. Pat. No. 4,522,958 (Das et al.).

The nanoparticles may be provided in the form of a colloidal dispersion. Examples of useful commercially available unmodified silica starting materials include nano-sized colloidal silicas available under the product designations NALCO 1040, 1050, 1060, 2326, 2327, and 2329 colloidal silica from Nalco Chemical Co., Naperville, Ill.; the organo-silica under the product name IPA-ST-MS, IPA-ST-L, IPA-ST, IPA-ST-UP, MA-ST-M, and MA-ST sols from Nissan Chemical America Co. Houston, Tex. and the SnowTex® ST-40, ST-50, ST-20L, ST-C, ST-N, ST-O, ST-OL, ST-ZL, ST-UP, and ST-OUP, also from Nissan Chemical America Co. Houston, Tex. The weight ratio of polymerizable material to nanoparticles can range from about 30:70, 40:60, 50:50, 55:45, 60:40, 70:30, 80:20 or 90:10 or more. The preferred ranges of wt % of nanoparticles range from about 10% by weight to about 60% by weight, and can depend on the density and size of the nanoparticles used.

In some cases, the nanovoided microstructured layer 300 may have a low optical haze value. In such cases, the optical haze of the nanovoided microstructured layer may be no more than about 5%, or no greater than about 4, 3.5, 3, 2.5, 2, 1.5, or 1%. For light normally incident on nanovoided microstructured layer 300, "optical haze" may (unless otherwise indicated) refer to the ratio of the transmitted light that deviates from the normal direction by more than 4 degrees to the total transmitted light. Index of refraction values of the disclosed films and layers may be measured by any suitable means, e.g., using a Metricon Model 2010 Prism Coupler, available from Metricon Corp., Pennington, N.J. Optical transmittance, clarity, and haze values of the disclosed films and layers can also be measured by any suitable means, e.g., using a Haze-Gard Plus haze meter, available from BYKGardiner, Silver Springs, Md.

In some cases, the nanovoided microstructured layer 300 may have a high optical haze. In such cases, the haze of the nanovoided microstructured layer 300 is at least about 40%, or at least about 50, 60, 70, 80, 90, or 95%.

In general, the nanovoided microstructured layer 300 can have any porosity or void volume fraction that may be desirable in an application. In some cases, the volume fraction of plurality of voids 320 in the nanovoided microstructured layer 300 is at least about 10%, or at least about 20, 30, 40, 50, 60, 70, 80, or 90%.

Binder 310 can be or include any material that may be desirable in an application. For example, binder 310 can be a light curable material that forms a polymer, such as a crosslinked polymer. In general, binder 310 can be any polymerizable material, such as a polymerizable material that is radiation-curable. In some embodiments binder 310 can be any polymerizable material, such as a polymerizable material that is thermally-curable.

Polymerizable material 310 can be any polymerizable material that can be polymerized by various conventional anionic, cationic, free radical, or other polymerization techniques, which can be initiated chemically, thermally, or by actinic radiation. Processes using actinic radiation include, e.g., visible and ultraviolet light, electron beam radiation and combinations thereof, among other means. The media that polymerizations can be carried out in include, e.g., solvent polymerization, emulsion polymerization, suspension polymerization, bulk polymerization, and the like.

Actinic radiation curable materials include monomers, and reactive oligomers, and polymers of acrylates, methacrylates, urethanes, epoxies, and the like. Representative examples of actinic radiation curable groups suitable in the practice of the present disclosure include epoxy groups, ethylenically unsaturated groups such as (meth)acrylate groups, olefinic carbon-carbon double bonds, allyloxy groups, alpha-methyl styrene groups, (meth)acrylamide groups, cyanoester groups, vinyl ether groups, combinations of these, and the like. Free radically polymerizable groups are preferred. In some embodiments, exemplary materials include acrylate and methacrylate functional monomers, oligomers, and polymers, and in particular, multifunctional monomers that can form a crosslinked network upon polymerization can be used, as known in the art. The polymerizable materials can include any mixture of monomers, oligomers, and polymers; however the materials should be at least partially soluble in at least one solvent. In some embodiments, the materials should be soluble in the solvent monomer mixture.

Solvent can be any solvent that forms a solution with the desired polymerizable material. The solvent can be a polar or a non-polar solvent, a high boiling point solvent or a low boiling point solvent, and in some embodiments the solvent includes a mixture of several solvents. The solvent or solvent mixture may be selected so that the microstructured layer 230 formed is at least partially insoluble in the solvent (or at least one of the solvents in a solvent mixture). In some embodiments, the solvent mixture can be a mixture of a solvent and a non-solvent for the polymerizable material. In one particular embodiment, the insoluble polymer matrix can be a three-dimensional polymer matrix having polymer chain linkages that provide the three dimensional framework. The polymer chain linkages can prevent deformation of the microstructured layer 230 after removal of the solvent.

In some cases, solvent can be easily removed from the solvent-laden microstructured layer 130, 230 by drying, for example, at temperatures not exceeding the decomposition temperature of either the insoluble polymer matrix or the substrate 216. In one particular embodiment, the temperature during drying is kept below a temperature at which the substrate is prone to deformation, e.g., a warping temperature or a glass-transition temperature of the substrate. Exemplary solvents include linear, branched, and cyclic hydrocarbons, alcohols, ketones, and ethers, including for example, propylene glycol ethers such as DOWANOL™ PM propylene glycol methyl ether, isopropyl alcohol, ethanol, toluene, ethyl acetate, 2-butanone, butyl acetate, methyl isobutyl ketone, methyl ethyl ketone, cyclohexanone, acetone, aromatic hydrocarbons, isophorone, butyrolactone, N-methylpyrrolidone, tetrahydrofuran, esters such as lactates, acetates, propylene glycol monomethyl ether acetate (PM acetate), diethylene glycol ethyl ether acetate (DE acetate), ethylene glycol butyl ether acetate (EB acetate), dipropylene glycol monomethyl acetate (DPM acetate), iso-alkyl esters, isohexyl acetate, isoheptyl acetate, isooctyl acetate, isononyl acetate, isodecyl acetate, isododecyl acetate, isotridecyl acetate or other iso-alkyl esters, water; combinations of these and the like.

The coating solution 215 can also include other ingredients including, e.g., initiators, curing agents, cure accelerators, catalysts, crosslinking agents, tackifiers, plasticizers, dyes, surfactants, flame retardants, coupling agents, pigments, impact modifiers including thermoplastic or thermoset polymers, flow control agents, foaming agents, fillers, glass and polymer microspheres and microparticles, other particles including electrically conductive particles, thermally conductive particles, fibers, antistatic agents, antioxidants, optical down converters such as phosphors, UV absorbers, and the like.

An initiator, such as a photoinitiator, can be used in an amount effective to facilitate polymerization of the monomers present in the coating solution. The amount of photoinitiator can vary depending upon, for example, the type of initiator, the molecular weight of the initiator, the intended application of the resulting microstructured layer, and the polymerization process including, e.g., the temperature of the process and the wavelength of the actinic radiation used. Useful photoinitiators include, for example, those available from Ciba Specialty Chemicals under the IRGACURE™ and DAROCURE™ trade designations, including IRGACURE™ 184 and IRGACURE™ 819.

The microstructured layer 230 may be cross-linked to provide a more rigid polymer network. Cross-linking can be achieved with or without a cross-linking agent by using high energy radiation such as gamma or electron beam radiation. In some embodiments, a cross-linking agent or a combination of cross-linking agents can be added to the mixture of polymerizable monomers, oligomers or polymers. The cross-linking can occur during polymerization of the polymer network using any of the actinic radiation sources described elsewhere.

Useful radiation curing cross-linking agents include multifunctional acrylates and methacrylates, such as those disclosed in U.S. Pat. No. 4,379,201 (Heilmann et al.), which include 1,6-hexanediol di(meth)acrylate, trimethylolpropane tri(meth)acrylate, 1,2-ethylene glycol di(meth)acrylate, pentaerythritol tri/tetra(meth)acrylate, triethylene glycol di(meth)acrylate, ethoxylated trimethylolpropane tri(meth) acrylate, glycerol tri(meth)acrylate, neopentyl glycol di(meth)acrylate, tetraethylene glycol di(meth)acrylate, 1,12-dodecanol di(meth)acrylate, copolymerizable aromatic ketone co-monomers such as those disclosed in U.S. Pat. No. 4,737,559 (Kellen et al.) and the like, and combinations thereof.

The coating solution 215 may also include a chain transfer agent. The chain transfer agent is preferably soluble in the monomer mixture prior to polymerization. Examples of suitable chain transfer agents include triethyl silane and mercaptans. In some embodiments, chain transfer can also occur to the solvent; however this may not be a preferred mechanism.

The polymerizing step preferably includes using a radiation source in an atmosphere that has a low oxygen concentration. Oxygen is known to quench free-radical polymerization, resulting in diminished extent of cure. The radiation source used for achieving polymerization and/or crosslinking may be actinic (e.g., radiation having a wavelength in the ultraviolet or visible region of the spectrum), accelerated particles (e.g., electron beam radiation), thermal (e.g., heat or infrared radiation), or the like. In some embodiments, the energy is actinic radiation or accelerated particles, because such energy provides excellent control over the initiation and rate of polymerization and/or crosslinking. Additionally, actinic radiation and accelerated particles can be used for curing at relatively low temperatures. This avoids degrading or evaporating components that might be sensitive to the relatively high temperatures that might be required to initiate polymerization and/or crosslinking of the energy curable groups when using thermal curing techniques. Suitable sources of curing energy include UV LEDs, visible LEDs, lasers, electron beams, mercury lamps, xenon lamps, carbon arc lamps, tungsten filament lamps, flashlamps, sunlight, low intensity ultraviolet light (black light), and the like.

In some embodiments, binder 310 includes a multifunctional acrylate and polyurethane. This binder 310 can be a polymerization product of a photoinitiator, a multifunctional acrylate, and a polyurethane oligomer. The combination of a multifunctional acrylate and a polyurethane oligomer can produce a more durable nanovoided microstructured layer 300. The polyurethane oligomer is ethylenically unsaturated. In some embodiments, the polyurethane or polyurethane oligomer is capable of reacting with acrylates or "capped" with an acrylate to be capable of reacting with other acrylates in the polymerization reaction described herein.

In one illustrative process described above in FIG. 2, a solution is prepared that includes a plurality of nanoparticles (optional), and a polymerizable material dissolved in a solvent, where the polymerizable material can include, for example, one or more types of monomers. The polymerizable material is coated onto a substrate and a tool is applied to the coating while the polymerizable material is polymerized, for example by applying heat or light, to form an insoluble polymer matrix in the solvent. In some cases, after the polymerization step, the solvent may still include some of the polymerizable material, although at a lower concentration. Next, the solvent is removed by drying or evaporating the solution resulting in nanovoided microstructured layer 300 that includes a network or plurality of voids 320 dispersed in polymer binder 310. The nanovoided microstructured layer 300 includes a plurality of nanoparticles 340 dispersed in the polymer binder. The nanoparticles are bound to the binder, where the bonding can be physical or chemical.

The fabrication of the nanovoided microstructured layer 300 and microstructured articles described herein using the processes described herein can be performed in a temperature range that is compatible with the use of organic substances, resins, films, and supports. In many embodiments, the peak process temperatures (as determined by an optical thermometer aimed at the nanovoided microstructured layer 300 and microstructured article surface) is 200 degrees centigrade or less, or 150 degrees centigrade or less or 100 degrees centigrade or less.

In general, nanovoided microstructured layer 300 can have a desirable porosity for any weight ratio of binder 310 to plurality of nanoparticles 340. Accordingly, in general, the weight ratio can be any value that may be desirable in an application. In some cases, the weight ratio of binder 310 to a plurality of nanoparticles 340 is at least about 1:2.5, or at least about 1:2.3, or 1:2, or 1:1, or 1.5:1, or 2:1, or 2.5:1, or 3:1, or 3.5:1, or 4:1, or 5:1. In some cases, the weight ratio is in a range from about 1:2.3 to about 4:1.

Figure 3A:
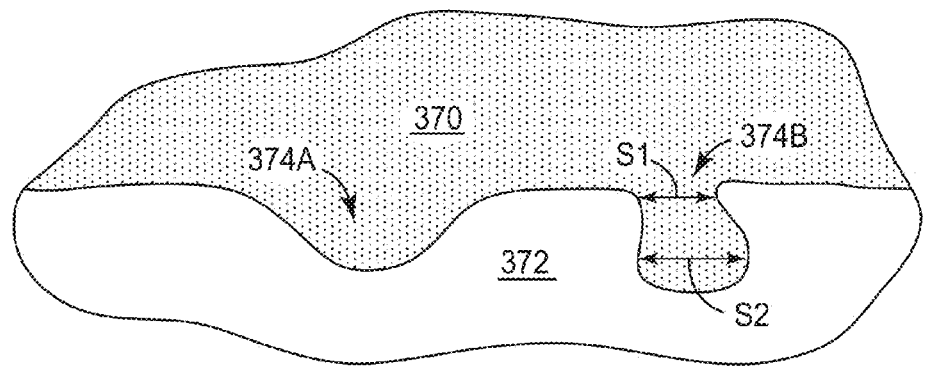
FIG. 3a is a schematic cross-sectional view of a portion of an interface between a first nanovoided layer and a second layer, demonstrating interpenetration of the second layer with the first layer.

We now pause to consider, in connection with FIG. 3a, whether there is any structural difference between (a) an article made by first forming a nanovoided layer with a microstructured surface, and then backfilling that microstructured surface with a conventional (non-nanovoided) material, e.g. a conventional polymer material, and (b) an article made by first forming a microstructured surface in a layer of conventional material, and then backfilling that microstructured surface with a nanovoided material layer. In both cases, the resulting article has an embedded interface, i.e., the microstructured surface, on one side of which is the nanovoided material layer and on the other side of which is the conventional material layer.

We have found that at least one structural difference can occur between the two articles, and that structural difference relates to the mechanism of interpenetration. In the article of case (b), where the layer of conventional material is microstructured before backfilling the microstructured surface with the nanovoided material, the nanovoided material would not typically migrate into the layer of conventional material because that layer typically presents a substantially solid, non-porous barrier at each facet or portion of the microstructured surface beyond which the nanovoided material cannot penetrate. In contrast, the article of case (a) is made in such a way that, at the time the conventional material (or precursor to such material, e.g. an uncured liquid polymer resin) is applied to the microstructured surface of the nanovoided layer, the facets or portions of the microstructured surface may contain surface voids, e.g. in the form of pits, pockets, or tunnels, into which the conventional material may migrate depending on properties of the surface voids, properties of the conventional material, and process conditions such as residence time of the conventional material in an uncured state. With suitable material properties and process conditions, the conventional material layer may interpenetrate the nanovoided layer, as shown schematically in FIG. 3a.

FIG. 3a shows in schematic cross-section a portion of an interface between a first nanovoided layer 372 and a second layer 370 of conventional material. The interface portion may, for example, be a microscopic portion of a structured surface defined between the two layers. The nanovoided layer 372 is shown to have a shallow surface void or depression 374A, as well as a deeper surface void 374B. The surface void 374B is characterized by a first transverse dimension S1 that is closer to the interface than a second transverse dimension S2, and the deeper dimension S2 is greater than the shallower dimension S1. We may characterize layer 370 as interpenetrating the layer 372 if the layer 370 not only conforms to the general shape of the layer 372 (e.g. depression 374A), but also if material from layer 370 migrates into or substantially fills at least some deep surface voids such as void 374a, in which a transverse dimension of the void nearer the interface is smaller than a transverse dimension farther from the interface. Such interpenetration can be achieved with nanovoided materials described herein.

In a first approach for characterizing an interpenetration depth of the conventional layer with the nanovoided layer, one may determine the amount by which material of the conventional layer has advanced beyond an interface average surface (along a direction or measurement axis perpendicular to the average surface), and one may characterize this amount in terms of the diameter of an average-sized void.

In a second approach for characterizing the interpenetration depth, one may again measure the amount by which the material of the conventional layer has advanced beyond the average surface, and then simply report this amount in terms of standard units of distance, e.g., micrometers or nanometers.

In a third approach for characterizing the interpenetration depth, one may again measure the amount by which the material of conventional layer has advanced beyond the average surface, but then characterize this amount in terms of the feature height of the structured surface at issue.

In exemplary embodiments, the interpenetration depth may be for example: with regard to the first approach, in a range from 1 to 10 average void diameters; with regard to the second approach, no more than 1, 10, 100, or 500 microns; with regard to the third approach, at least 5% of the feature height, or at least 10%, or at least 50%, or at least 95%, or at least 100%, or no more than 5%, or no more than 10%, or no more than 25%, or in a range from 5 to 25%, of the feature height. These exemplary ranges, however, should not be construed as limiting. The third approach of characterizing the interpenetration depth may be particularly suitable when dealing with microstructured surfaces that have particularly small feature sizes, e.g., in which the feature-to-feature pitch is less than 1 micron.

Further discussion regarding interpenetration can be found in commonly assigned U.S. provisional patent application 61/405,128 entitled "Optical Films With Microstructured Low Refractive Index Nanovoided Layers and Methods Therefor", filed on even date herewith.

That U.S. application also discusses shrinkage issues that have been observed when microreplicating nanovoided polymer materials, and how issues regarding shrinkage relate to the feature height of the structured surface (e.g., axial distance between the highest point and the lowest point on the structured surface), the aspect ratio of the features of the structured surface (e.g. feature height divided by feature pitch, where feature pitch may be the center-to-center spacing between nearest neighbor features in the structured surface), void volume fraction of the nanovoided material (the fractional volume of the nanovoided material occupied by the voids), refractive index of the nanovoided material, and formulation (e.g. weight % solids) of the coating solution precursor to the nanovoided layer. For example, in order to replicate larger microstructures using low concentration formulations of the coating solution, in the range of 30-45% solids, compensation of the microstructure geometry on the tool may be used to account for material shrinkage, so that the desired feature shape can be successfully made. The application discusses certain desirable relationships associated with a reduced amount of shrinkage or of other distortion of the microstructured surface. In one such relationship, the microstructured surface is characterized by a structure height (e.g. the difference between dimension 419b and 419a in FIG. 4) of at least 15 microns and an aspect ratio (structure height divided by structure pitch, see pitch P1 in FIGS. 4 and 5) greater than 0.3, and: the nanovoided layer has a void volume fraction in a range from 30% to 55%; and/or the nanovoided layer has a refractive index in a range from 1.21 to 1.35, or 1.21 to 1.32; and/or the coating solution precursor to the nanovoided layer has a wt % solids in a range from 45% to 70%, or from 50% to 70%. Relationships such as these can be advantageously applied to the present disclosure as well.

Optical Extraction Films and Film/Light Source Combinations

The disclosed nanovoided layers can be advantageously incorporated into optical films that can be combined in some fashion with OLEDs or other self-emissive light sources, particularly such sources that are pixelated, so as to enhance light extraction and reduce losses in such sources. The films can be designed to be applied to an exterior light-emitting surface of the light source, which is manufactured separately from the optical film.

Figure 4:
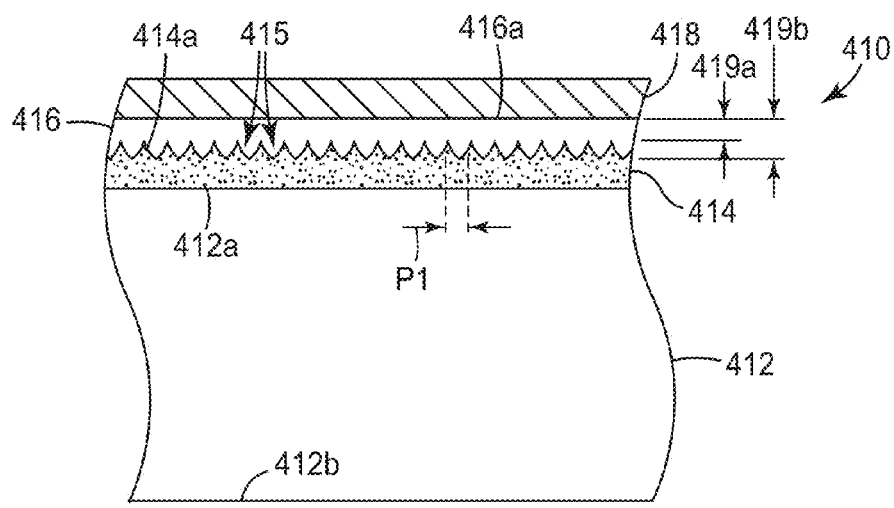
FIG. 4 is a schematic side or cross-sectional view of an optical extraction film that can be used with a top-emitting OLED.

FIG. 4 is a schematic side or cross-sectional view of an optical extraction film that can be used with a top-emitting OLED, e.g., a pixelated top-emitting OLED. An optical extraction film 410 includes a flexible carrier film 412 and various layers carried by (e.g. attached to) the film 412. Among these layers is a nanovoided layer 414 and another layer 416, between which an embedded interface forming a structured surface 414a is formed. The nanovoided layer preferably has a refractive index for visible light well below that of conventional polymeric materials, e.g., below 1.35 or 1.3, or in a range from 1.15 to 1.3 or 1.15 to 1.35, for example. The other layer 416 is preferably composed of a polymer material or other suitable material that is not nanovoided and that has a refractive index greater than that of the nanovoided layer. The difference in refractive index between the layers 414, 416 is desirably relatively large, e.g., at least 0.2, or 0.3, or 0.4, or 0.5 or more. The difference in refractive indices allows the structured surface 414a to function as an optical interface capable of extracting light from an OLED or other self-emissive light source, as described elsewhere herein.

The structured surface 414a may be tailored to have any contour or shape that is effective in extracting light from the light source, i.e., coupling "wasted" light out of the light source so that it can be used in the intended application. Wasted light in this regard refers to light that would be trapped in the light source or otherwise lost, e.g., emitted from an edge of the light source in directions that do not contribute to useful illumination in the display or other intended lighting applications. In exemplary embodiments, the structured surface is shaped to define individual light extraction elements 415. The elements 415 are shown as having curved surfaces which may represent curved linear prisms or an array of lenticular elements arranged in two orthogonal directions (e.g., directions that define a plane along which the structured surface generally extends), but the extraction elements may in general have any suitable shape without limitation, e.g., lenticular, prismatic, 1-dimensional (linearly extending) or 2-dimensional, for example, and the extraction elements of a given structured surface need not all have the same size and/or shape, although they may have the same size and/or shape if desired. In exemplary embodiments, the extraction elements 415 are characterized by a center-to-center spacing or pitch P1 between nearest neighbors. In cases where the extraction elements are not uniformly distributed or spaced from each other, the pitch P1 may represent an average center-to-center spacing of the extraction elements.

The structured surface 414a and/or extraction elements 415 may also be characterized by a distance or thickness from a surface of the extraction film that is adapted to couple to the self-emissive light source. In the case of extraction film 410, this coupling surface is the outer major surface 416a of layer 416. A release liner 418, which is shown covering the layer 416, is preferably incorporated into the product so as to protect the coupling surface 416a from damage until the extraction film is ready to be applied to the light source. Two characteristic distances are labeled in the figure. Distance 419a is the thickness of the continuous land portion of the layer 416 between the coupling surface 416a and the structured surface 414a. The land is thus bounded on one side by the coupling surface, and on the opposite side by a plane that is parallel to the coupling surface and that intersects the structured surface at the point(s) of the structured surface that is/are closest to the coupling surface. The other characteristic distance, 419b, is the distance between the coupling surface 416a and a plane that is parallel to the coupling surface and that intersects the structured surface at the point(s) of the structured surface that is/are farthest away from the coupling surface. Stated differently, the land thickness or distance 419a can be considered to be the smallest axial distance between the coupling surface 416a and the structured surface 414a, and the distance 419b can be considered to be the largest axial distance between the coupling surface 416a and the structured surface 414a.

In cases where the extraction film 410 is intended to enhance light extraction by reducing the amount of light that is totally internally reflected at an outermost surface or boundary of the self-emissive light source, we have found it advantageous to design the extraction film 410 such that the land thickness 419a is relatively small. For example, the land thickness 419a may be less than 50 microns, or less than 25 microns, or less than 10 microns, although these values should not be construed as limiting. In some cases there may be no land. In yet other cases the structured nanovoided features may be non-contiguous. The land thickness 419a may also be less than a thickness of the flexible substrate 412. The land thickness 419a may also be so thin that the layer 416 is not suitable as a free-standing support film in roll-to-roll processing systems such as is depicted in FIG. 2. Stated differently, if the layer 416 could be separated from all the other portions of extraction film 410, it may not have sufficient physical strength or integrity to be subjected to forces ordinarily encountered in industrial roll-to-roll processing systems without excessive tearing, warping, or curling, for example. The land thickness 419a may also if desired be chosen to be large enough so that a substantial portion of the light extraction elements 415 is not disposed within an evanescent zone of the self-emissive light source.

We have also found it advantageous, again in cases where the film 410 is intended to enhance light extraction by reducing TIR, to tailor the extraction features 415 such that their pitch P1 is relatively large, e.g., greater than 1 micron. The feature heights, i.e., the difference between distance 419b and distance 419a, may also if desired be greater than 1 micron. The feature heights and transverse dimensions may be sufficiently large, e.g., greater than 1, 5, 10, or 20 microns, that the functionality of the extraction features is principally governed by principles of optical refraction rather than, for example, optical diffraction.

The optical extraction film 410 may be fabricated using a wide variety of manufacturing techniques, including without limitation continuous techniques and batch techniques. A particularly advantageous manufacturing technique is a continuous cast and cure (3C) roll-to-roll process such as that shown schematically in FIG. 2. Such a technique allows the film to be made continuously in potentially high volumes, and then converted (e.g. cut or slit) into large numbers of piece parts or sheets whose sizes are tailored for the intended end-use application(s). In such cases, the flexible carrier film 412 may have physical characteristics, such as a composition and thickness, that make it suitable as a free-standing support film similar to substrate 216 in FIG. 2. In many cases, a film composed of a conventional light-transmissive polymer such as polyethylene terephthalate (PET) or polyethylene naphthalate (PEN), or copolymers thereof, would need to have a film thickness greater than about 2 mils (about 50 microns) in order to possess the necessary film strength to allow it to be used for such a purpose.

In some cases, the structured surface 414a may be fabricated not with a casting-and-curing technique but with any other suitable technique capable of producing the desired extraction features in the desired layers. For example, imprinting, embossing, and injection molding may also be used to form the structured surface 414a in some cases. However, if the extraction film 410 is made using a process similar to that of FIG. 2, the layer 416 may constitute a backfill layer that was produced after the formation of the nanovoided layer 414 and the structured surface 414a. Consequently, depending on materials selection and process conditions, the layer 416 may interpenetrate the nanovoided layer 414 as discussed in connection with FIG. 3a.

The carrier film 412, the nanovoided layer 414, and the other layer 416 are preferably all highly transmissive to light from the light source, although small to moderate amounts of haze in one, some, or all of these layers may be tolerable and/or desirable in specific applications. The layers preferably transmit light emitted by the light source with low loss so that, after the extraction film is attached to the light source, a large fraction of light from the light source that traverses the coupling surface 416a will exit the extraction film at the opposite outer surface 412b and contribute to system illumination. The carrier film 412 may comprise PET, PEN, copolymers thereof, glass (including flexible glass), or other suitable transparent or translucent materials. The carrier film 412 may also comprise a multilayer film of alternative layer of PET, PEN, and copolymers thereof. The carrier film may additionally comprise birefringence, fluorescence, and absorption layer(s) to enable advanced optical functions such as polarization and wavelength selection/conversion. The carrier film 412 may also function as a barrier layer to prevent water vapor and oxygen from reaching the light source after the extraction film is attached to the light source. Exemplary ultrabarrier films include multilayer films made, for example, by vacuum deposition of two inorganic dielectric materials sequentially in a multitude of layers on a glass or other suitable substrate, or alternating layers of inorganic materials and organic polymers, as described in U.S. Pat. Nos. 5,440,446 (Shaw et al.), 5,877,895 (Shaw et al.), and 6,010,751 (Shaw et al.), which are incorporated herein by reference in their entireties. The nanovoided layer 414 may comprise any of the light-transmissive nanovoided materials disclosed herein. The other layer 416 may comprise any suitable light-transmissive material. In exemplary embodiments the layer 416 may be or comprise a light-transmissive pressure-sensitive adhesive or other visco-elastic material. Representative visco-elastic materials are discussed in the commonly assigned U.S. provisional patent application 61/405,128 referenced elsewhere herein. Use of a transparent adhesive for layer 416 allows the extraction film to be attached directly to an outer surface of the self-emissive light source with no intervening material layers. Use of a viscoelastic material for layer 416 allows the extraction film (and in particular the coupling surface 416a of the extraction film) to flow to some extent so as to conform to a non-planar emitting surface of an OLED.

In general, viscoelastic materials exhibit both elastic and viscous behavior when undergoing deformation. Elastic characteristics refer to the ability of a material to return to its original shape after a transient load is removed. One measure of elasticity for a material is referred to as the tensile set value which is a function of the elongation remaining after the material has been stretched and subsequently allowed to recover (destretch) under the same conditions by which it was stretched. If a material has a tensile set value of 0%, then it has returned to its original length upon relaxation, whereas if the tensile set value is 100%, then the material is twice its original length upon relaxation. Tensile set values may be measured using ASTM D412. Useful viscoelastic materials may have tensile set values of greater than about 10%, greater than about 30%, or greater than about 50%; or from about 5 to about 70%, from about 10 to about 70%, from about 30 to about 70%, or from about 10 to about 60%.

Viscous materials that are Newtonian liquids have viscous characteristics that obey Newton's law, which states that stress increases linearly with shear gradient. A liquid does not recover its shape as the shear gradient is removed. Viscous characteristics of useful viscoelastic materials include flowability of the material under reasonable temperatures such that the material does not decompose.

Useful viscoelastic materials may have a storage modulus, G', of less than about 300,000 Pa, measured at 10 rad/sec and a temperature of from about 20 to about 22° C. Useful viscoelastic materials may have a storage modulus, G', of from about 30 to about 300,000, or from about 30 to about 150,000, or from about 30 to about 30,000 Pa, measured at 10 rad/sec and a temperature of from about 20 to about 22° C. Useful viscoelastic materials may have a storage modulus, G', of from about 30 to about 150,000 Pa, measured at 10 rad/sec and a temperature of from about 20 to about 22° C., and a loss tangent (tan d) of from about 0.4 to about 3. Viscoelastic properties of materials can be measured using Dynamic Mechanical Analysis according to, for example, ASTM D4065, D4440, and D5279.

The light extraction film 410 may of course include other layers in addition to those depicted in FIG. 4, and other features or characteristics in addition to those already discussed. For example, materials may be incorporated within the film to enhance light extraction through scattering or to filter, color shift, or polarize the light. Surface coatings or structures, for example functional layers, can be applied to the air surface of the light extraction film in order to further increase the functionality and possibly the value of the light extraction film. Such surface coatings can have, for example, optical, mechanical, chemical, or electrical functions. Examples of such coatings or structures include those having the following functions or properties: antifog; antistatic; antiglare; antireflection; antiabrasion (scratch resistance); antismudge; hydrophobic; hydrophilic; adhesion promotion; refractive elements; color filtering; ultraviolet (UV) filtering; spectral filtering; color shifting; color modification; polarization modification (linear or circular); light redirection; diffusion; or optical rotation. Other possible layers to be applied to the air surface include a barrier layer or a transparent electrically conductive material. The release liner 418 may be omitted, and/or another release liner may be provided on the other side of the extraction film to protect the output surface 412b.

Figure 5:
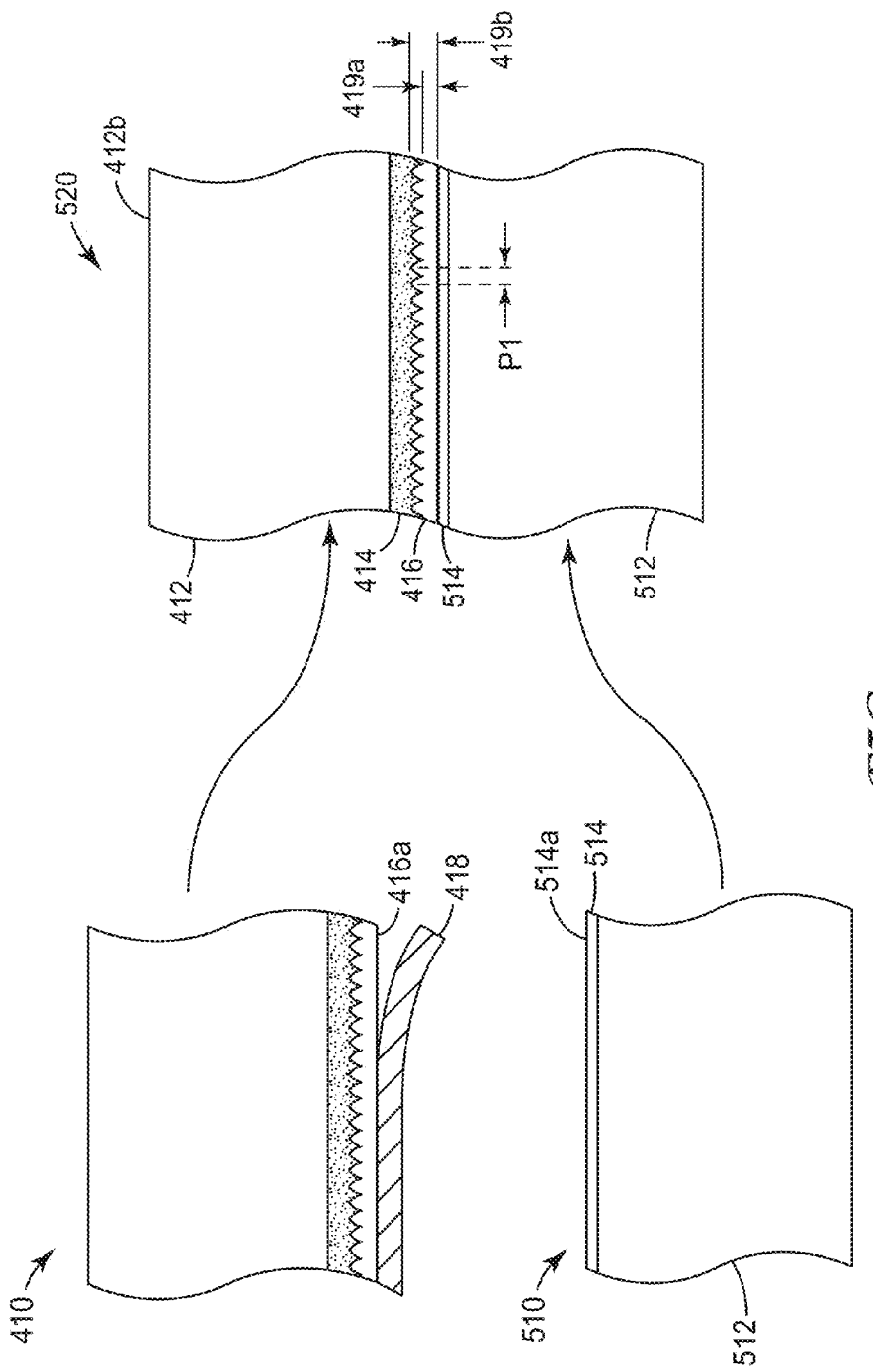
FIG. 5 is a schematic side or cross-sectional view which shows how a particular optical extraction film can be applied to a top-emitting OLED.

FIG. 5 shows one way in which an optical extraction film, such as that of FIG. 4, can be applied to a top-emitting OLED or other suitable self-emissive light source which is fabricated separately from the extraction film, so as to produce an enhanced light-emitting optical device. A top-emitting OLED 510 is depicted only schematically for ease of discussion. The OLED includes at least a substrate 512 and a thin, high refractive index light emitting core or region 514. The substrate may function as a barrier layer to prevent water vapor and oxygen from reaching the region 514 from one side, and the substrate may also have mechanical and thermal functionality, such as a heat sink to draw heat away from the region 514. The substrate 512 may also comprise a backplane. Individual layers that make up the region 514 may be deposited, formed, or applied in a suitable sequence atop the substrate 510. The high index region 514 typically includes at least one organic layer tailored to emit light of a desired wavelength in response to an applied electric current or field, and at least one transparent electrode. Other high refractive index layers can also be included in the thin high index region 514. An outer surface 514a of the region 514 can be considered to be a light emitting surface of the OLED 510.

In order to provide enhanced optical performance of the OLED, the optical extraction film 410 is applied to the light emitting surface 514a of the OLED. Before application, the appropriate release liner or premask 418 is removed from the film to expose a pristine optical coupling surface 416a. In some cases, the optical coupling surface of the optical extraction film may be placed directly against the light emitting surface 514a of the OLED. If the outermost layer of the extraction film is a pressure sensitive adhesive or other suitable light transmissive adhesive, the direct contact between the optical coupling surface of the optical extraction film and the light emitting surface of the OLED may be sufficient to produce a firm bond between the two components with no significant air gap therebetween.

In other cases, a thin optical coupling layer may be provided between the optical coupling surface of the optical extraction film and the light emitting surface 514a of the OLED. The optical coupling layer may serve several functions. One function may be to planarize the emitting surface of the OLED. In many pixelated top-emissive OLEDs, for example, the substrate may have surface features associated with pixel and sub-pixel wells. The optical coupling layer may be used to fill the wells or other surface features so as to provide a planar surface that the coupling surface of the optical extraction film can attach to with no air gaps or pockets. Another function of the optical coupling layer may be to attach the optical extraction film to the OLED, e.g., in cases where the outermost layer of the extraction film is not a pressure sensitive adhesive or other suitable adhesive. In some cases, the optical coupling layer, if included in the construction, may have a refractive index as close to that of the high index region 514 of the OLED as possible so that waveguiding modes within the high index region, or their associated evanescent zone, can be extended closer to the coupling surface of the extraction film. The optical coupling layer may, for example, have a refractive index between that of the high index region 514 and the layer whose outer surface corresponds to the coupling surface of the optical extraction film. Suitable optical coupling layers comprise light-transmissive material such as high-index adhesives and nanoparticle-filled polymers. Suitable optical coupling layers are also typically as thin as possible while performing their necessary function(s) so as to minimize the distance between the coupling surface of the extraction film and the light emitting surface of the OLED. A typical optical coupling layer may, for example, have a thickness in a range from 0.5 to 20 microns, but other thicknesses may also be used.

Whether or not an optical coupling layer is used, attachment of the optical extraction film to the OLED results in enhanced operation of the resulting OLED device. The optical extraction film, whether by reducing waveguiding modes, reducing total internal reflection of light, or by other mechanisms, can provide increased useful illumination, sometimes also referred to as increased gain, of the OLED when used in a given optical system. The increased illumination or gain may be characterized or measured in terms of the total luminance integrated over the hemisphere of possible output directions from the output surface of the OLED device, or may be measured in other ways such as increased illumination along a particular direction of interest, e.g., increased on-axis illumination or gain along the direction perpendicular to the OLED output surface.

Besides increasing the useful illumination or gain of the OLED device, exemplary optical extraction films also have the advantage that they can provide a flat or planar outer surface that serves as the output surface of the OLED/film combination. Extraction film 410 is shown as having a flat surface 412b, and it is this surface that may become the output surface of the OLED device after the film is applied. Advantageously, the delicate structured surface(s) responsible for the increased output of the OLED, e.g., structured surface 414a, is embedded within the film and within the device, being safely protected from abrasion, dirt, dust, oils, and other detrimental agents by the flexible carrier layer 412. A flat output surface can thus be seen to be beneficial in many applications, but in some cases it may be desirable to emboss or otherwise pattern the output surface of the OLED/film combination (e.g. surface 412b) to provide an exposed structured surface that further modifies the light distribution emitted by the device.

Further information on design aspects of optical extraction films suitable for use with pixelated OLEDs, including but not limited to extraction films having more than one embedded structured surface, extraction films that can serve as a substrate on which an OLED can be fabricated, extraction films whose extraction features have dimensions (e.g. pitch of less than 1 micron) such that the functionality of the extraction features is principally governed by principles of optical diffraction rather than optical refraction, extraction films whose extraction features have dimensions (e.g. pitch of greater than 1 micron) such that the functionality of the extraction features is principally governed by principles of optical refraction rather than optical diffraction, extraction films in which a substantial portion of the light extraction elements is disposed within an evanescent zone of the light source when the coupling surface is placed against an emitting surface of the light source, and extraction films in which a substantial portion of the light extraction elements is disposed outside of or beyond an evanescent zone of the light source when the coupling surface is placed against an emitting surface of the light source, can be found in commonly assigned U.S. application Ser. No. 12/908,798, "Light Extraction Films for Organic Light Emitting Devices (OLEDs)", filed on even date herewith and incorporated herein by reference in its entirety.

Pixelated OLED Devices

Figure 6:
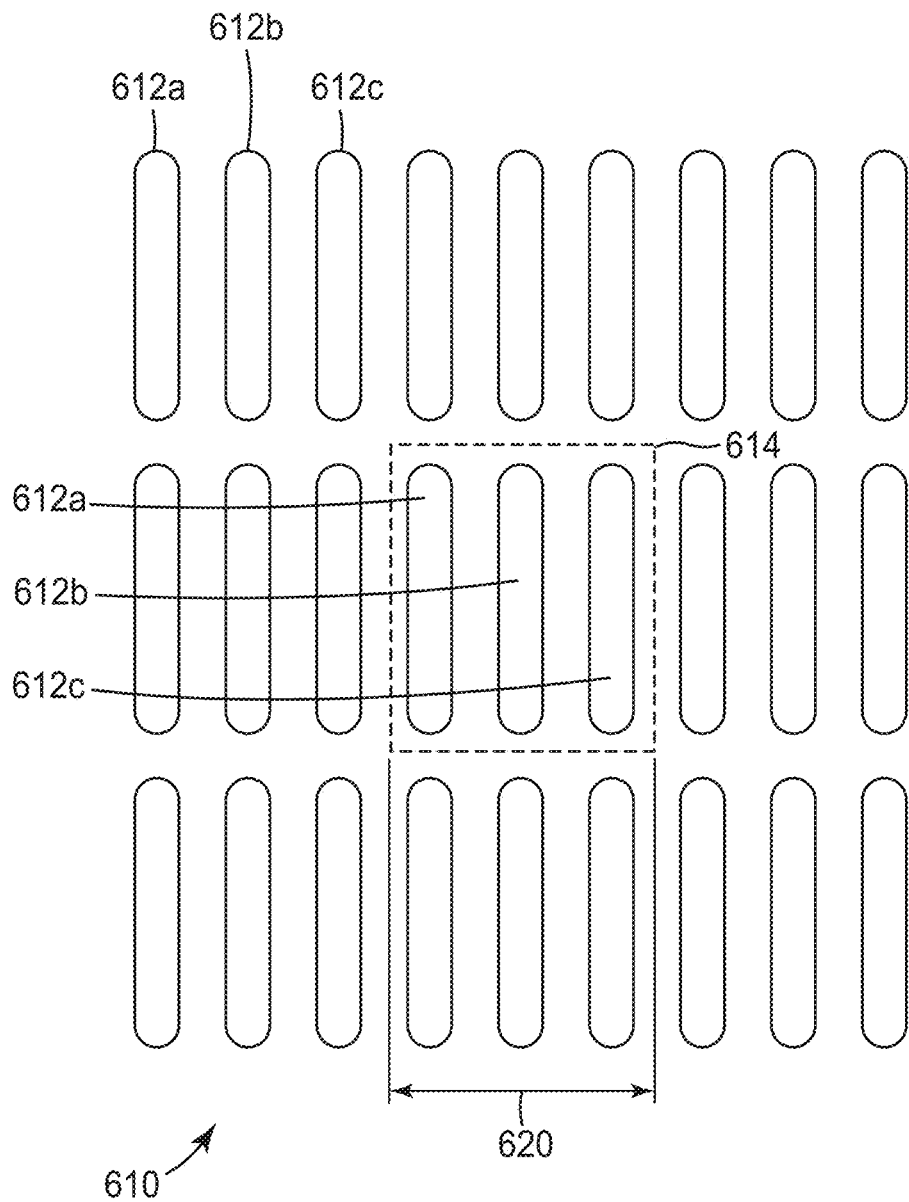
FIG. 6 is a schematic top view of a representative pixelated OLED device.

The disclosed optical extraction films and film/OLED combinations can be practiced with a wide variety of different types of known OLEDs, including non-pixelated OLEDS that may typically be used in lighting applications. They are however of particular utility when used with pixelated OLEDS that may typically be used to generate images in an electronic display. FIG. 6 is a schematic top view of a typical pixelated OLED 610. The OLED 610 is patterned to form distinct light-emitting areas 612a, 612b, 612c, and non-emitting areas between the emitting areas. Each of the emitting areas is preferably individually electronically addressable. The light-emitting areas are arranged in a repeating pattern to form a large array, such that any given light-emitting area or set of areas within the array can be illuminated at any given time to provide a static or video image.

In a monochrome display, the areas 612a-c may emit light of the same spectral content or color. In this case, each individual area 612a, 612b, 612c may represent a single pixel. In a color display, the areas 612a-c may emit light of different colors, e.g., areas 612a may emit red light, areas 612b may emit green light, and areas 612c may emit blue light. Other colors and color combinations are also possible, and the OLED may include more or fewer than three different colored areas, as is known in the pixelated display arts. In color displays, the different colored areas are typically grouped together to form pixels, in which case each individual emitting area within a given pixel may be referred to as a subpixel. In the case where OLED 610 is adapted for a color display, and where area 612a emits red light, area 612b emits green light, and area 612c emits blue light, the area 614 may in one embodiment be considered to be a single pixel. The size of that pixel may be characterized by various transverse dimensions, i.e., dimensions measured in the plane of the figure. In cases where the pixel has a nominally rectangular shape, two relevant dimensions may be the length (span of the longer side) and the width (span of the shorter side) of the rectangle. Dimension 620 represents the width of pixel 614. Another relevant dimension may be the maximum transverse dimension, such as the length of the diagonal of a rectangular pixel. Note that if OLED 610 emitted monochrome light such that each individual area 612a, etc. was a pixel, then that smaller pixel would have the same length as pixel 614, but one-third the width of pixel 614. Alternatively, if OLED 610 required four (rather than three) neighboring emitting areas to constitute a pixel, that pixel would have the same length as pixel 614, but a width that was 4/3 times the width of pixel 614.

Figure 7A:
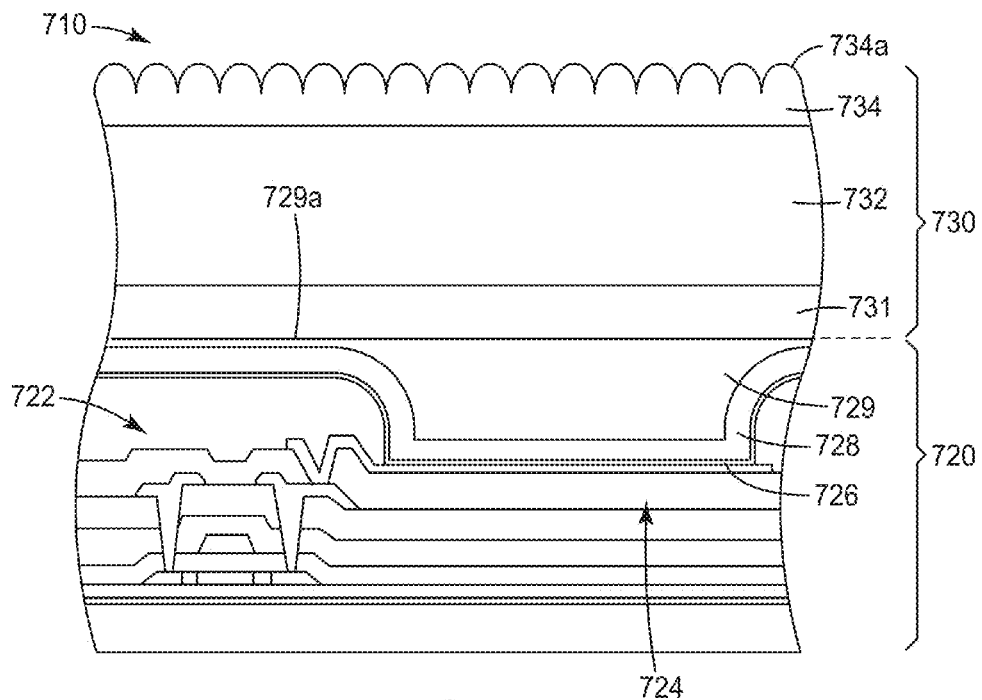
FIG. 7a is a schematic side or cross-sectional view of a device that results from an ordinary optical extraction film being applied to a pixelated top-emitting OLED.
Figure 7B:
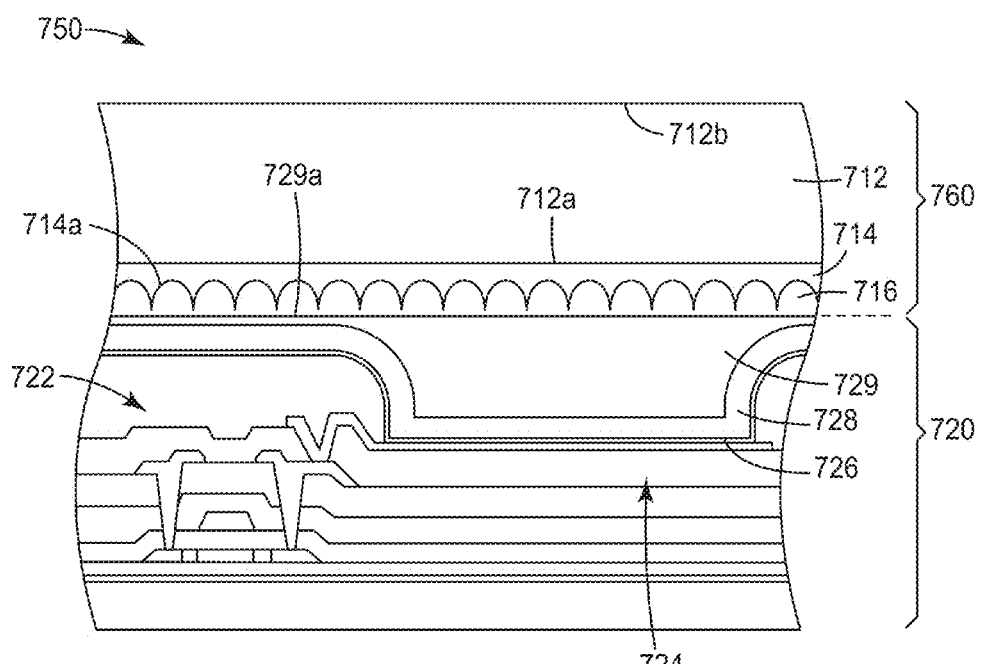
FIG. 7b is a schematic side or cross-sectional view of a device that results from an optical extraction film as disclosed herein being applied to the pixelated top-emitting OLED.

FIGS. 7a and 7b demonstrate the difference between extracting light from a pixelated top-emitting OLED with an ordinary structured surface film, whose structured surface is exposed to air (non-embedded), and extracting light from the same pixelated top-emitting OLED with an extraction film that incorporates the disclosed nanovoided layer and embedded structured surface. Stated simply, use of the nanovoided layer and embedded structured surface allows the structured surface to be disposed much closer to the OLED than that of the other film. This is because the nanovoided layer allows the extraction film of FIG. 7b to be flipped over relative to that of FIG. 7a, such that the carrier film need not be interposed between the OLED and the structured surface. Instead, the (embedded) structured surface can be disposed between the carrier film and the OLED, and the land portion of the extraction film between the (embedded) structured surface and the OLED can be made to have a thickness (e.g., less than 50, 25, or 10 microns) that is substantially less than that of a typical carrier film. Positioning the structured surface closer to the pixelated OLED can have significant advantages for reducing blurring of the pixels, particularly for OLEDs with small pixel sizes. Blurring of the pixels can arise when the structured surface of the extraction film contains refractive structures that scatter light in different directions.

An analogy can be drawn between such scattering and the scattering produced by an ordinary sheet of waxed paper. If a sheet of waxed paper is placed directly atop a page of printed text, an observer may still be able to discern the text through the waxed paper. However, if the waxed paper is slowly lifted so that the distance between the text and the scattering waxed paper increases, the text quickly becomes illegible because the boundaries of the letters of text become too blurred by the scattering action of the waxed paper. Analogous to this, the embedded structured surface of FIG. 7b may produce little to no blurring of the pixelated OLED compared to the structured surface of FIG. 7a, as a result of the much closer proximity of the former structured surface to the OLED compared to that of the latter structured surface.

Thus, FIG. 7a depicts a portion of a device 710 that results from an ordinary optical extraction film 730 being applied to a pixelated top-emitting OLED 720, and FIG. 7b depicts a portion of a device 750 that results from an optical extraction film 760, which incorporates a nanovoided layer and an embedded structured surface, being applied to the same pixelated top-emitting OLED 720. In the figures, the labeled components of the OLED 720 include: a driver/controller 722; a light emitting area (such as a pixel) 724; an organic light generating layer 726; a transparent conductor 728; and an optical coupling layer 729 that planarizes the OLED to provide a flat light-emitting surface 729a. In FIG. 7a, an extraction film 730 having an exposed structured surface 734a is applied to the OLED. The extraction film 730 includes: a carrier film 732; an adhesive layer 731 to attach the carrier film to the OLED; and a coating layer 734 that has been embossed or otherwise formed to provide a structured surface 734a, which may be shaped to define light extraction elements such as lenticular prisms or lenses that are large enough to function based on principles of refraction. None of the individual layers of extraction film 730 are nanovoided layers. In contrast, the extraction film 760 may have a construction similar to that described in connection with FIG. 4, for example. Film 760 thus includes: a carrier film 712; a nanovoided layer 714, which may have a refractive index in a range from 1.15 to 1.35, or 1.15 to 1.3; a layer 716 of higher refractive index than the nanovoided layer 714, the layer 716 preferably being a backfill and having an interface with the nanovoided layer that defines a structured surface 714a with extraction elements 715, which elements 715 may be lenticular prisms or lenses that are large enough to function based on principles of refraction. A land portion of the layer 716 between the structured surface 714a and the surface 716a may be less than 50 microns, or less than 25 microns, or less than 10 microns, for example. Light from the pixelated OLED is in each case emitted from an uppermost (from the viewpoint of FIGS. 7a and 7b) surface of the extraction film, i.e., from structured surface 734a in FIG. 7a, and from planar surface 712b in FIG. 7b.

As explained above, the capability of the extraction film 760 to position the structured surface closer to the pixelated OLED than the extraction film 730 results in an advantage of reduced blurring for the extraction film 760. Furthermore, the embedded nature of the structured surface of film 760 provides advantage of robustness or resistance to damage from abrasion or other detrimental agents relative to the exposed nature of the structured surface of film 730.

EXAMPLES

In the following examples, all parts, percentages, ratios, etc. are by weight, unless noted otherwise. Solvents and other reagents used were obtained from Sigma-Aldrich Chemical Company, Milwaukee, Wis. unless specified differently.

Example 1

50/60 Bullet-Shaped Extractors, Adhesive Backfill, No Haze in ULI

A computer simulation was performed of an OLED with an embedded extraction layer using ray tracing methods and the modeling package LIGHTTOOLS (commercially available from Optical Research Associates, Pasadena, Calif.). The configuration that was simulated is shown generally as OLED device 520 in FIG. 5. The microreplicated nanovoided material of Ultra Low Index (ULI) (see e.g. layer 414 in FIG. 5) was modeled as having a refractive index of 1.2 and zero haze. The refractive index of the carrier film or substrate (see e.g. layer 412 in FIG. 5) was selected to be 1.65 to model a polyethylene terephthalate (PET) substrate. The refractive index of the backfill layer (see e.g. layer 416 of FIG. 5) was selected to be 1.48 to model Soken 2032 pressure sensitive adhesive (commercially available from Soken Chemical & Engineering Co., Ltd, Japan), which is a viscoelastic material. The substrate was assumed to have a thickness of 100 μm.

Figure 8A:
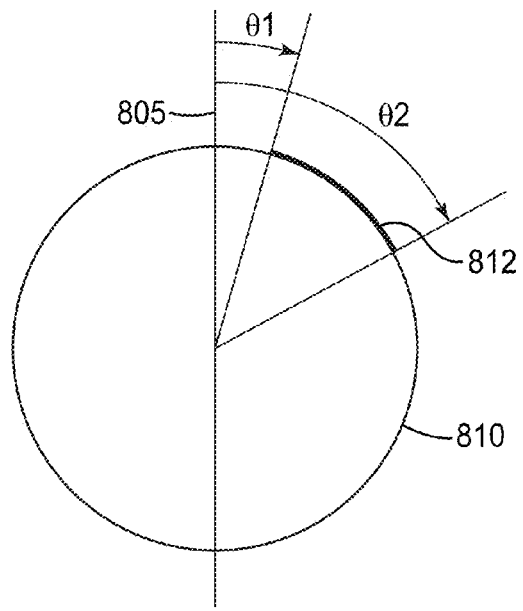
FIG. 8a is an illustration that shows how an arc of circle can be defined.
Figure 8B:
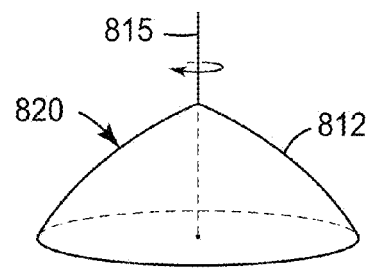
FIG. 8b is an illustration that shows how that defined arc can be used to define a three-dimensional bullet-like shape usable as an extraction element.

The extraction structure (see e.g. the structured surface in FIG. 5) was an array of bullet-shaped extraction elements with a 50 μm pitch, the array having a hexagonal arrangement of extraction elements in top or plan view. The shape of each extraction element is given by a surface of revolution generated by rotating a segment of a circle about an axis, explained more fully by reference to FIGS. 8a and 8b. The curved segment 812 used to define the bullet-shapes in Example 1 was the segment of a circle 810 lying between an angle θ1 and an angle θ2 as measured from an axis 805 in the plane of the circle that passes through the center of the circle. In the bullet shapes of Example 1, θ1 was 50 degrees and θ2 was 60 degrees. The segment 812 was then rotated about an axis 815, the axis 815 being parallel to axis 805 but intersecting the endpoint of the curved segment, so as to generate the bullet-shaped surface of revolution 820.

The optical performance of this optical extraction film bonded onto the substrate side of an OLED was simulated and the color uniformity was determined as the maximum angular color deviation in the CIE 1976 L*u*v* color space (CIE Standard S 014-5/E:2009). In terms of the (u', v') chromaticity coordinates, the color deviation is given by $$\Delta u'v' = \sqrt{(u'-u'_0)^2 + (v'-v'_0)^2},$$

where $(u'_0, v'_0)$ are the chromaticity coordinates of a reference source—in this case the axial luminance of the OLED—to evaluate the angular color uniformity. The integral gain was determined as the integrated power ratio of the OLED with the extraction film and the OLED without the extraction film. The parameters of the OLED used in the simulation were based on experimental measurements of a Philips Lumiblade OLED (available from Philips Lighting U.S., Somerset, N.J.). We used experimentally measured OLED characteristics in the model and optimization. The OLED was first apertured down to 1 cm×1 cm surface area, and then optically coupled at the substrate side with index-matching oil to a 2.5-inch-diameter BK7 half ball lens, whose spherical surface was antireflection-coated. Because the refractive index of the OLED substrate closely matches the BK7 half-ball lens, the reflection and refraction at the outer substrate surface are eliminated, allowing accurate measurement of the OLED emission into the substrate and the OLED reflection at the OLED/substrate interface. Specifically, the angular-spectral luminance and reflectivity of the OLED were characterized and used in the simulation. When combined with computer-designed extraction layer profiles, the OLED device can be modeled accurately. The computed color deviation as a function of angle is given in Table 1 below, where the angle is the observation angle in air relative to the optical axis or surface normal of the modeled device. The maximum angular color non-uniformity with and without the embedded extraction film was 0.0115 and 0.0242, respectively. The integral gain with the modeled extraction film was 1.48.

TABLE 1

| Angle (degrees) | Δu'v' OLED with Extraction Film | Δu'v' Original OLED |
|---|---|---|
| 88.5 | 0.0060 | 0.0242 |
| 85.5 | 0.0053 | 0.0219 |
| 82.5 | 0.0058 | 0.0202 |
| 79.5 | 0.0057 | 0.0193 |
| 76.5 | 0.0072 | 0.0189 |
| 73.5 | 0.0055 | 0.0182 |
| 70.5 | 0.0065 | 0.0178 |
| 67.5 | 0.0075 | 0.0174 |
| 64.5 | 0.0072 | 0.0171 |
| 61.5 | 0.0080 | 0.0166 |
| 58.5 | 0.0090 | 0.0158 |
| 55.5 | 0.0091 | 0.0150 |
| 52.5 | 0.0105 | 0.0143 |
| 49.5 | 0.0115 | 0.0134 |
| 46.5 | 0.0108 | 0.0124 |
| 43.5 | 0.0115 | 0.0115 |
| 40.5 | 0.0108 | 0.0102 |
| 37.5 | 0.0108 | 0.0088 |
| 34.5 | 0.0098 | 0.0073 |
| 31.5 | 0.0105 | 0.0061 |
| 28.5 | 0.0089 | 0.0048 |
| 25.5 | 0.0072 | 0.0036 |
| 22.5 | 0.0055 | 0.0027 |
| 19.5 | 0.0059 | 0.0015 |
| 16.5 | 0.0049 | 0.0010 |
| 13.5 | 0.0051 | 0.0005 |
| 10.5 | 0.0042 | 0.0005 |
| 7.5 | 0.0018 | 0.0003 |
| 4.5 | 0.0032 | 0.0006 |
| 1.5 | 0.0000 | 0.0000 |

Figure 9A:
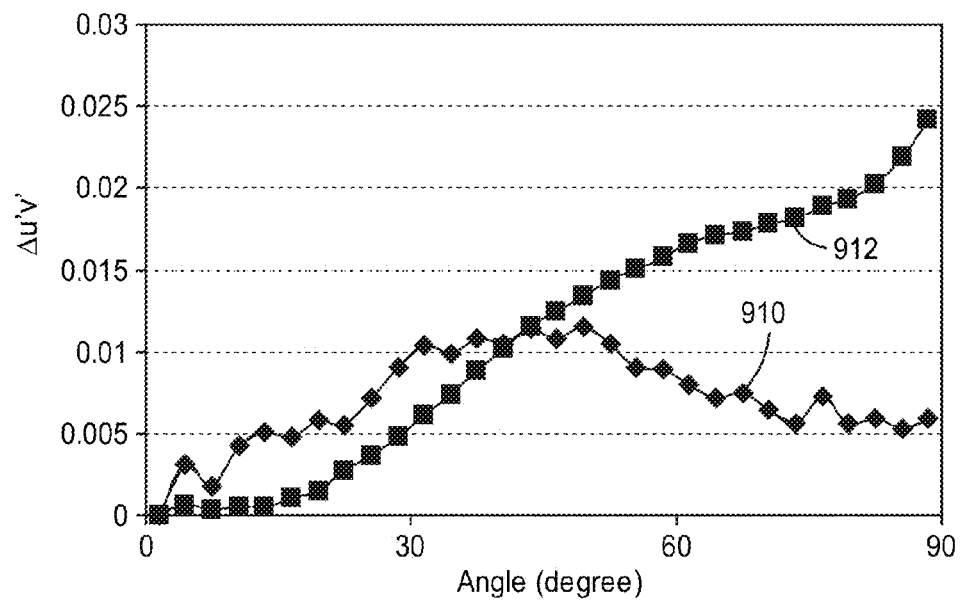
FIG. 9a is a graph that compares the actual measured color variation of a particular top-emitting OLED with the calculated color variation of a modeled device in which an optical extraction film is applied to that same OLED.

These results are plotted in FIG. 9a, where curve 910 is the color deviation of the modeled OLED/extraction film combination, and curve 912 is the color deviation of the OLED with no extraction film.

Example 2

50/60 Bullet-Shaped Extractors, Adhesive Backfill, Haze in ULI

An OLED with an optical extraction film was simulated in the same way as in Example 1, except that some haze was included in the nanovoided Ultra Low Index (ULI) layer. This was simulated by adding scattering centers to the simulated nanovoided layer, where the scattering centers scattered light primarily in the forward 45° cone angle, and with a scattering probability set at 20% (i.e., the probability for a light ray to be scattered at least once upon traveling through the layer was set to 20%). With this built-in haze in the nanovoided layer of the simulated extraction film, the angular color non-uniformity was reduced to 0.010, and the integral gain was improved to 1.51.

Example 3

50/60 Bullet-Shaped Extractors, HRI Backfill, No Haze in ULI

An OLED with an optical extraction film was simulated in the same way as in Example 1, except that the refractive index of the nanovoided ULI material was set to 1.26 (rather than 1.2), and the refractive index of the backfill material (see e.g. layer 416 in FIG. 5) was chosen to be 1.65 (rather than 1.48) which is representative of a high refractive index curable resin such as a nanozirconia-filled UV curable acrylate resin, such as those described in U.S. Pat. No. 7,547,476 (Jones et al.).

The color non-uniformity and integral gain were determined as in Example 1. The calculated color deviation is given in Table 2. The maximum angular color non-uniformity with and without the optical extraction film was 0.0083 and 0.0242, respectively. The integral gain with the extraction film was 1.55.

TABLE 2

| Angle (degrees) | Δu'v' OLED with Extraction Film | Δu'v' Original OLED |
|---|---|---|
| 88.5 | 0.0022 | 0.0242 |
| 85.5 | 0.0030 | 0.0219 |
| 82.5 | 0.0053 | 0.0202 |
| 79.5 | 0.0083 | 0.0193 |
| 76.5 | 0.0072 | 0.0189 |
| 73.5 | 0.0072 | 0.0182 |
| 70.5 | 0.0072 | 0.0178 |
| 67.5 | 0.0060 | 0.0174 |
| 64.5 | 0.0059 | 0.0171 |
| 61.5 | 0.0054 | 0.0166 |
| 58.5 | 0.0060 | 0.0158 |
| 55.5 | 0.0058 | 0.0150 |
| 52.5 | 0.0048 | 0.0143 |
| 49.5 | 0.0065 | 0.0134 |
| 46.5 | 0.0058 | 0.0124 |
| 43.5 | 0.0075 | 0.0115 |
| 40.5 | 0.0062 | 0.0102 |
| 37.5 | 0.0067 | 0.0088 |
| 34.5 | 0.0068 | 0.0073 |
| 31.5 | 0.0070 | 0.0061 |
| 28.5 | 0.0055 | 0.0048 |
| 25.5 | 0.0040 | 0.0036 |

TABLE 2-continued

| Angle (degrees) | Δu'v' OLED with Extraction Film | Δu'v' Original OLED |
|---|---|---|
| 22.5 | 0.0037 | 0.0027 |
| 19.5 | 0.0020 | 0.0015 |
| 16.5 | 0.0014 | 0.0010 |
| 13.5 | 0.0013 | 0.0005 |
| 10.5 | 0.0008 | 0.0005 |
| 7.5 | 0.0002 | 0.0003 |
| 4.5 | 0.0010 | 0.0006 |
| 1.5 | 0.0000 | 0.0000 |

Figure 9B:
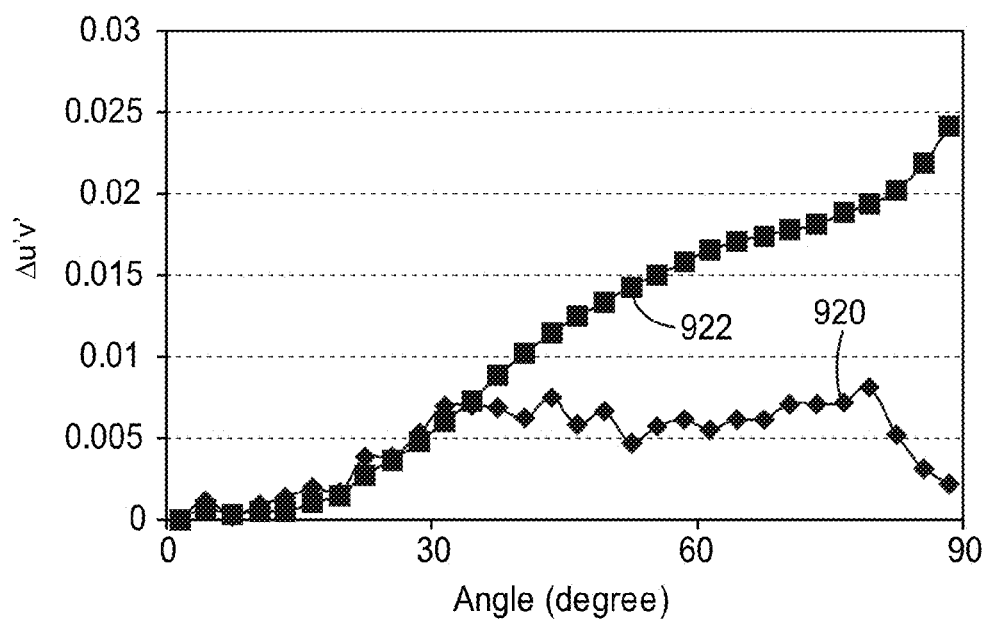
FIGS. 9b and 9c are graphs similar to that of FIG. 9a but for modeled devices in which different optical extraction films are applied to the OLED.

These results are plotted in FIG. 9b, where curve 920 is the color deviation of the modeled OLED/extraction film combination, and curve 922 is the color deviation of the OLED with no extraction film.

Example 4

50/60 Bullet-Shaped Extractors, HRI Backfill, Haze in ULI

An OLED with an optical extraction film was simulated in the same way as in Example 3, except that some haze was included in the nanovoided Ultra Low Index (ULI) layer, the same haze as described in Example 2. The color non-uniformity and integral gain were determined as in Example 1. The angular color non-uniformity was reduced to 0.007, and the integral gain was improved to 1.57.

Example 5

Bullet-Shaped Extractors Plus 1-D Prism Array

An OLED with an extraction film was simulated in the same way as in Example 1, except that a 1-dimensional (i.e., linearly extending) prism film was added to the substrate on the side opposite the OLED layer (see e.g. surface 412b in FIG. 5), with the peaks of the prisms facing away from the OLED layer. The pitch of the prism array was 50 μm. The refractive index of the prism material was chosen to be the same as the substrate (n=1.65) and all other device parameters were the same as those in Example 1.

The calculated color deviation is given in Table 3. The maximum color non-uniformity was 0.0126 and the integrated gain was 1.34. Although the integrated gain is lower than that of Examples 1 and 2, the emitted light was substantially collimated in this example.

TABLE 3

| Angle (degrees) | Δu'v' OLED with Extraction Film | Δu'v' Original OLED |
|---|---|---|
| 88.5 | 0.008 | 0.0242 |
| 85.5 | 0.0105 | 0.0219 |
| 82.5 | 0.0074 | 0.0202 |
| 79.5 | 0.0066 | 0.0193 |
| 76.5 | 0.005 | 0.0189 |
| 73.5 | 0.0079 | 0.0182 |
| 70.5 | 0.0067 | 0.0178 |
| 67.5 | 0.0084 | 0.0174 |
| 64.5 | 0.01 | 0.0171 |
| 61.5 | 0.0126 | 0.0166 |
| 58.5 | 0.0118 | 0.0158 |
| 55.5 | 0.0122 | 0.0150 |
| 52.5 | 0.0119 | 0.0143 |
| 49.5 | 0.0098 | 0.0134 |

TABLE 3-continued

| Angle (degrees) | Δu'v' OLED with Extraction Film | Δu'v' Original OLED |
|---|---|---|
| 46.5 | 0.0111 | 0.0124 |
| 43.5 | 0.011 | 0.0115 |
| 40.5 | 0.01 | 0.0102 |
| 37.5 | 0.009 | 0.0088 |
| 34.5 | 0.0085 | 0.0073 |
| 31.5 | 0.0062 | 0.0061 |
| 28.5 | 0.0048 | 0.0048 |
| 25.5 | 0.0035 | 0.0036 |
| 22.5 | 0.0036 | 0.0027 |
| 19.5 | 0.0029 | 0.0015 |
| 16.5 | 0.0024 | 0.0010 |
| 13.5 | 0.0029 | 0.0005 |
| 10.5 | 0.0023 | 0.0005 |
| 7.5 | 0.0018 | 0.0003 |
| 4.5 | 0.0002 | 0.0006 |
| 1.5 | 0.0000 | 0.0000 |

Figure 9C:
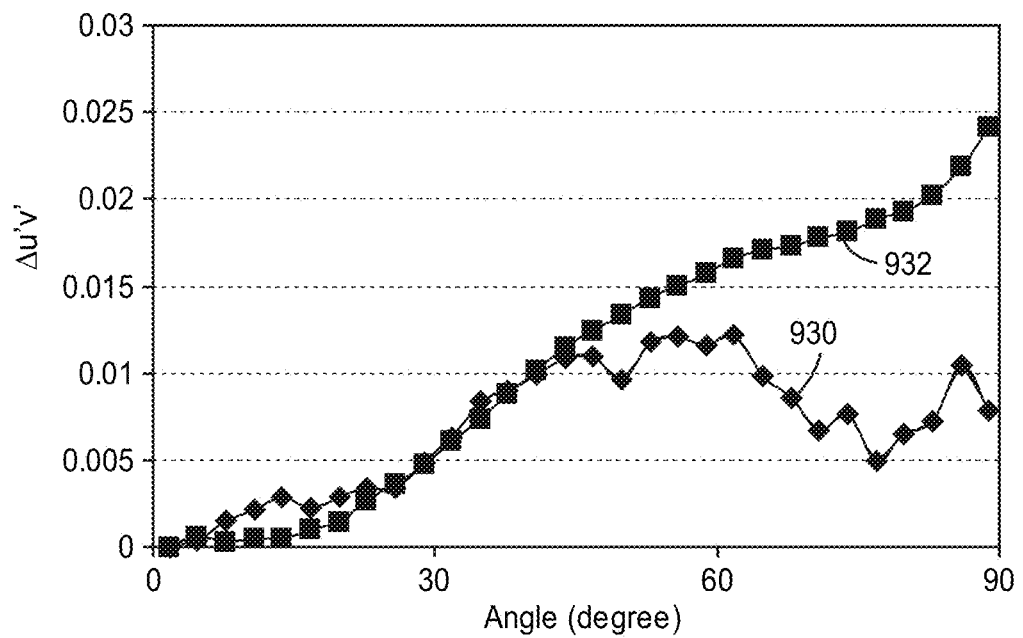

These results are plotted in FIG. 9c, where curve 930 is the color deviation of the modeled OLED/extraction film combination, and curve 932 is the color deviation of the OLED with no extraction film.

Example 6

Pixel Blur Analysis for Embedded Light Extraction Film

The pixel blurring effect of the embedded light extraction film was modeled using the LIGHTTOOLS ray tracing software (commercially available from Optical Research Associates, Pasadena, Calif.). The stack construction was the same as that in Example 1, but with the following dimensions: the pitch size of the extraction layer was 5 μm, the total thickness of the extraction layer was 10 μm, and the land thickness (the distance between the bottom of the extraction texture (structured surface) to the top of the OLED emitter) was set to either 1 μm or to 5 μm. The simulation included a surface detector which was placed immediately above the embedded extraction surface (below the extraction substrate) to analyze the lateral light spreading. A comparative embodiment was also simulated, which utilized an exterior or exposed structured surface (see e.g. the extraction film orientation of FIG. 7a), having the same bullet-shaped extraction features but facing the opposite direction, and the land thickness of this embodiment (the distance between the bottom of the structured surface to the top of the OLED emitter) was set to 50 microns.

Figure 10:
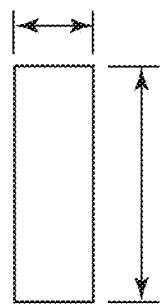
FIG. 10 is a top or front view of an exemplary OLED pixel.
Figure 11A:
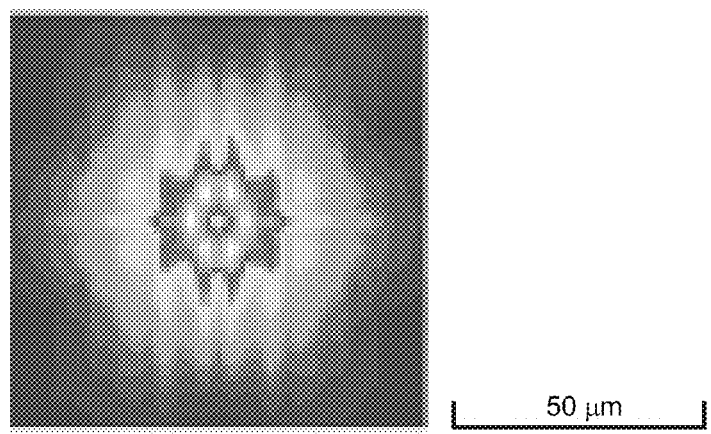
FIGS. 11a, 11b, and 11c are plots of point spread functions for extraction films having land thicknesses of 50 microns, 5 microns, and 1 micron, respectively.
Figure 11B:
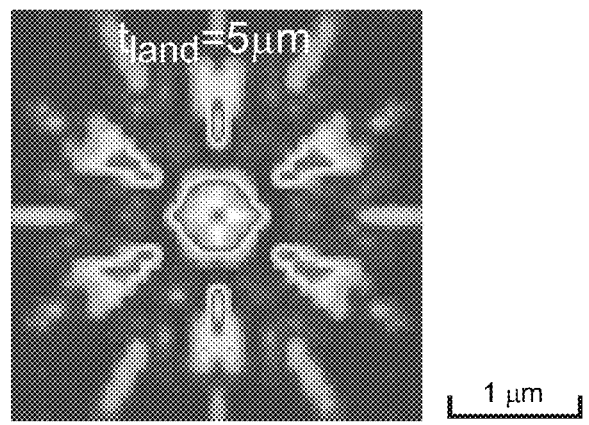
Figure 11C:
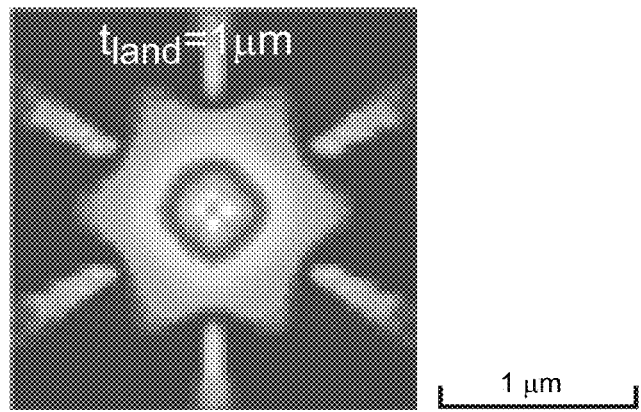
Figure 12A:
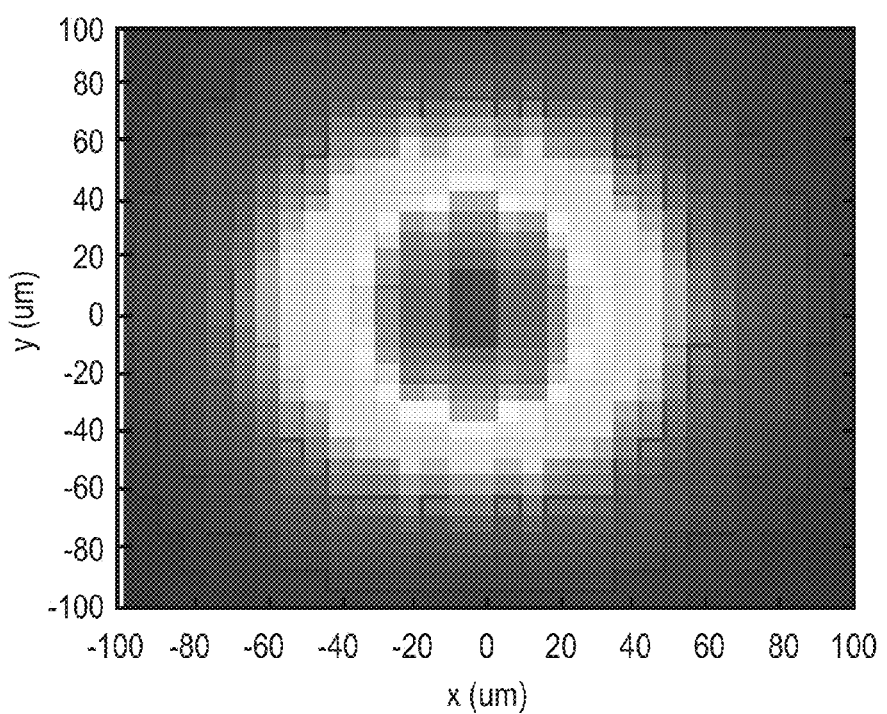
FIGS. 12a, 12b, and 12c are plots of the OLED pixel appearance after it is blurred by the extraction features of optical extraction films having land thicknesses of 50 microns, 5 microns, and 1 micron, respectively.

The point spread function, which represents the lateral spreading of an infinitely small point source after passing through an optical system, was calculated for all three embodiments. The point spread function for the 50 micron land comparative embodiment is shown in FIG. 11a, the point spread function for the 5 micron land (embedded structured surface) embodiment is shown in FIG. 11b, and the point spread function for the 1 micron land (embedded structured surface) embodiment is shown in FIG. 11c. The amount by which the appearance of an OLED pixel becomes blurred can be determined by the mathematical convolution of the point spread function and the original OLED pixel shape. This was calculated for a rectangular-shaped OLED pixel as shown in the top or front view of FIG. 10, where the width was set to 20 microns and the width was set to 60 microns. The resulting appearance can be seen in FIG. 12a for the 50 micron land comparative embodiment, and in FIG. 12b for the 5 micron land (embedded structured surface) embodiment, and in FIG.

Figure 12B:
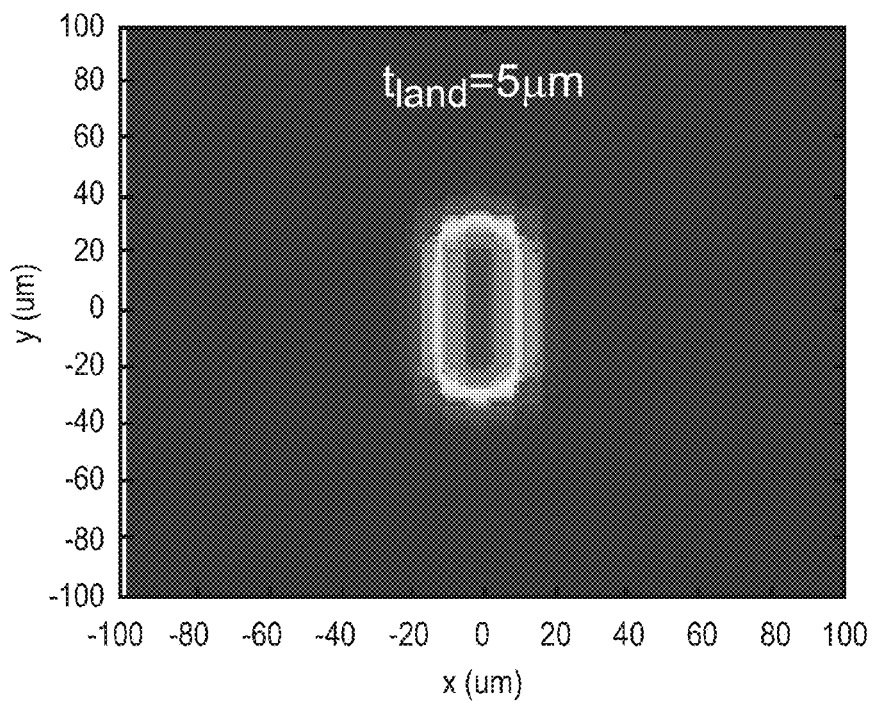
Figure 12C:
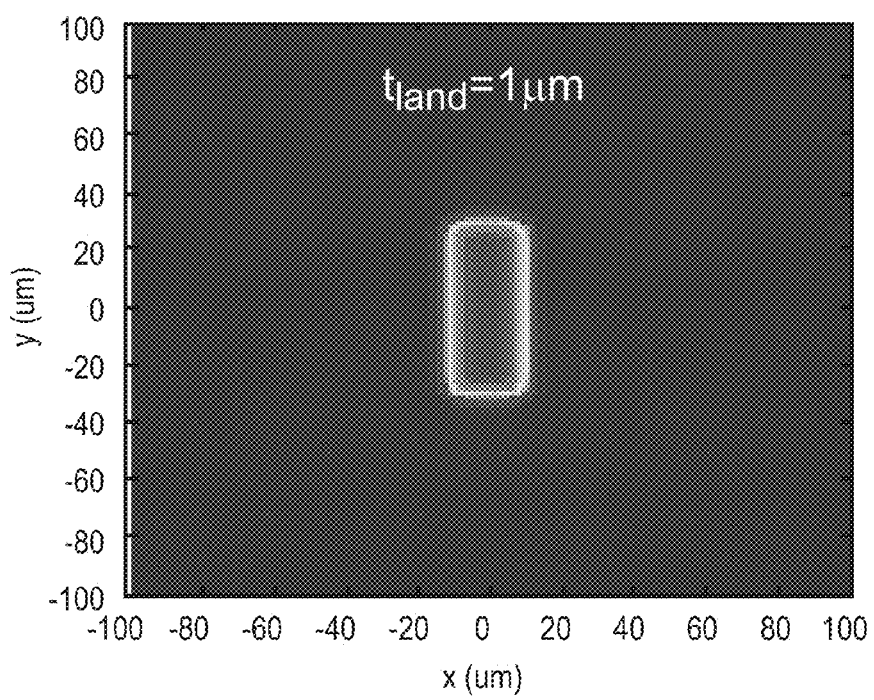

12c for the 1 micron land (embedded structured surface) embodiment. The pixel blurring was significantly reduced with a land thickness of 1 µm (FIG. 12c) compared to a land thickness of 5 µm (FIG. 12b), but even with a land thickness of 5 µm, the blurring of the pixel did not extend over the area of the adjacent pixel and would be acceptable for most display applications. The amount of blurring in FIGS. 12b and 12c are both substantially reduced compared to the blurring seed in FIG. 12a.

The perceived pixel lateral extent "L" in any dimension can be considered to be the extent over which 90% of the optical energy is confined. This lateral extent is typically larger than the physical pixel extent "D". The pixel blur "B" can then be defined as the percentage difference between these two values, i.e., [(L−D)/D]%. The perceived pixel lateral extent "L" in any dimension should be less than 2P, 1.5P, 1.0P, where "P" is the pixel pitch in that dimension. Because the pixel blur is defined as a function of the perceived pixel lateral extent "L", the acceptable pixel blur can be expressed as: B<(2P−D)/D, or B<(1.5P−D)/D, or B<(1P−D)/D. The point spread function is another measure of pixel blur. A broader point spread function is typically associated with more significant pixel blur.

Example 7

Low haze ULI, Soken PSA Backfill

Light extraction films were made with microreplicated nanovoided material (also referred to as Ultra Low Index or ULI material) as described below. Detailed information about microreplicated ULI and the process for making microreplicated ULI structures can be found in the commonly assigned U.S. provisional patent application 61/405,128 referenced elsewhere herein.

Bullet-Shaped Microreplication Tooling

Bullet-shaped microreplication tooling was made for this Example 7 using an excimer laser machining process as described in U.S. Pat. No. 6,285,001 (Fleming et al.). The resulting pattern was translated into a copper roll having an inverted bullet shape where the bullet features were arranged in a closely packed hexagon pattern with 50 µm pitch and the shape of the bullet was substantially as described in Example 1, except that the curved arc that defines the surface of revolution was bounded by angles θ1=25 degrees and θ2=65 degrees. The copper roll was then used as a replication master for a continuous cast and cure process using Accentrim resin (a urethane containing UV curable acrylate resin with a composition of 75% by weight PHOTOMER 6210 available from Cognis and 25% 1,6-hexanedioldiacrylate available from Aldrich Chemical Co., and a photoinitiator, 1% by weight Darocur 1173 from Ciba Specialty Chemicals). The Accentrim resin was cast onto a PET support film (DuPont 618 PET Film, 5 mil thickness) and then cured against a precision cylindrical tool using ultraviolet light.

A-174 Treated Silica Nanoparticles

In a 2 liter three-neck flask, equipped with a condenser and a thermometer, 960 grams of IPA-ST-UP organosilica elongated particles (available from Nissan Chemical Inc., Houston, Tex.), 19.2 grams of deionized water, and 350 grams of 1-methoxy-2-propanol were mixed under rapid stirring. The elongated particles had a diameter in a range from about 9 nm to about 15 nm and a length in a range of about 40 nm to about 100 nm. The particles were dispersed in a 15.2% wt IPA. Next, 22.8 grams of Silquest A-174 silane (available from GE Advanced Materials, Wilton, Conn.) was added to the flask. The resulting mixture was stirred for 30 minutes.

The mixture was kept at 81° C. for 16 hours. Next, the solution was allowed to cool down to room temperature. Next, about 950 grams of the solvent in the solution were removed using a rotary evaporator under a 40° C. water-bath, resulting in a 41.7 wt % A-174-modified elongated silica clear dispersion in 1-methoxy-2-propanol.

Low Haze, Low Index Formulation (ULI Resin)

To an amber glass jar was added 194.1 g of a 41.78 wt % solution of A-174 treated silica nanoparticles IPA-ST-UP in 1-methoxcy-2-propanol. To the jar was also added 64.87 g of Sartomer SR 444 and 40.5 g of Sartomer CN 9893 (both available from Sartomer Company, Exton, Pa.) as a 40% solution in ethyl acetate, 1.458 g of Irgacure 184, 0.48 g of Irgacure 819 (both available from Ciba Specialty Chemicals Company, High Point, N.C.), and 1.5 g of TEGO® Rad 2250 (available from Evonik Tego Chemie GmbH, Essen, Germany). The contents of the formulation were mixed thoroughly, giving a UV curable ULI resin with 50.5% solids by weight.

Ultra Low Index (ULI) Structures

Figure 8C:
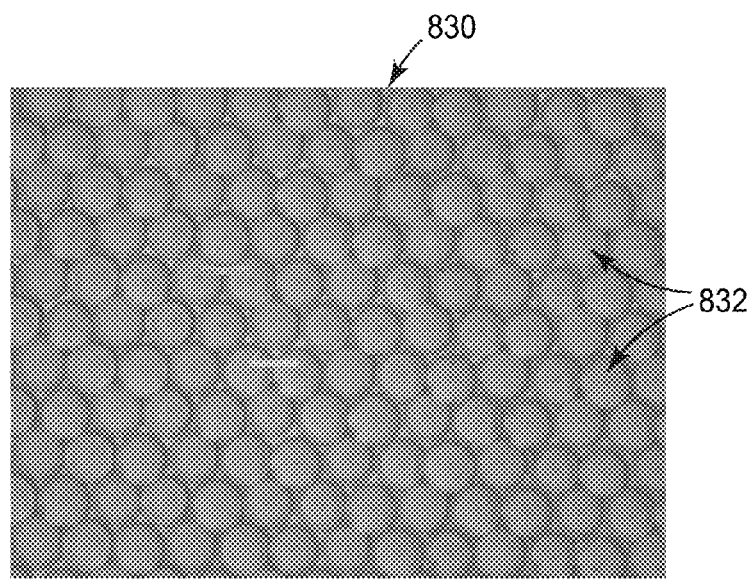
FIG. 8c is a micrograph showing a top view of a fabricated material having a structured surface comprising an array of such extraction elements.

The bullet film from the above-mentioned continuous cast and cure process was taken and treated for release. The release treatment consisted of first an oxygen plasma treatment of the film 500 ccm $O_2$ at 200 W for 20 seconds followed by a tetramethylsilane (TMS) plasma treatment, 200 ccm TMS at 150 W for 90 seconds. This film was then used as the replication master for a continuous cast and cure process to micro-replicate ultra low index (ULI) structures. The ULI resin was 50.5% solids by weight and was replicated on 3 mil thick primed PET film. The resin was cured using an LED curing system running at 35.3V and 5.85 amps. The microreplicated ULI films were postcured using a Fusion Lamp (H-Bulb). The refractive index of the microreplicated ULI layer was measured using a Metricon Model 2010 Prism Coupler (available from Metricon Corporation, Pennington, N.J.) and was found to be about 1.25. FIG. 8c shows an optical micrograph of the structured surface 830 of the ULI replica that was made, where individual bullet-shaped extraction elements 832 are clearly visible.

Extraction Film

The ULI film was backfilled with Soken 2032 pressure sensitive adhesive (commercially available from Soken Chemical & Engineering Co., Ltd, Japan) by lamination under pressure using a heated roller laminator with rollers at 230° F. Full filling of the PSA into the ULI bullet template was confirmed by optical microscopy. The film was also interrogated with a laser pointer and a similar refraction pattern was observed as for the bullet film tool that was replicated from the original copper tool.

The optical performance of this light extraction film was evaluated by bonding the backfilled adhesive layer of the extraction film to the substrate side of a Philips Lumiblade OLED test vehicle (available from Philips Lighting U.S., Somerset, N.J.). The integral gain was measured as the integrated power ratio of the OLED with the extraction film and the OLED without the extraction film. The maximum angular color non-uniformity with the embedded extraction film showed an improvement relative to the OLED without the embedded extraction film. The integral gain with the embedded extraction film was 1.28.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. An optical extraction film for enhancing light extraction from a self-emissive pixelated light source that has an outer surface, the extraction film having a major coupling surface adapted to attach to the outer surface of the light source, the extraction film comprising:
    a flexible carrier film; and
    a first and a second layer carried by the carrier film, the first and second layers defining therebetween an embedded interface that forms a structured surface of light extraction elements;
    wherein the first layer is nanovoided and comprises a polymer binder, the first layer also being disposed between the second layer and the carrier film; and
    wherein the second layer has a refractive index greater than that of the first layer, and the first layer has a refractive index less than 1.35.

2. The extraction film of claim 1, wherein the major coupling surface is a surface of the second layer opposite the structured surface, and wherein the second layer includes a land portion bounded on one side by the major coupling surface and bounded on an opposite side by a plane that is parallel to the coupling surface and that intersects the structured surface at point(s) of the structured surface closest to the major coupling surface.

3. The extraction film of claim 2, wherein the land portion has a thickness less than 50 micrometers.

4. The extraction film of claim 3, wherein the land portion has a thickness less than 25 micrometers.

5. The extraction film of claim 4, wherein the land portion has a thickness less than 10 micrometers.

6. The extraction film of claim 2, wherein the land portion has a thickness in a range from 0.1 to 25 micrometers.

7. The extraction film of claim 2, wherein the land portion is thinner than the carrier film.

8. The extraction film of claim 1, wherein the first layer has a refractive index less than 1.3.

9. The extraction film of claim 1, wherein the second layer has a refractive index greater than 1.4.

10. The extraction film of claim 1, wherein a refractive index difference between the first and second layers is at least 0.3.

11. The extraction film of claim 1, wherein the second layer comprises a light transmissive polymer.

12. The extraction film of claim 11, wherein the polymer comprises a light transmissive viscoelastic material.

13. The extraction film of claim 1, further comprising a release liner or premask covering the major coupling surface.

14. The extraction film of claim 1, wherein the light extraction elements have a pitch greater than 1 micron.

15. The extraction film of claim 1 in combination with the self-emissive pixelated light source, wherein the light extraction film couples to the self-emissive pixelated light source to enhance light extraction therefrom.

16. The combination of claim 15, wherein the extraction film attaches to the outer surface of the light source with no air gap therebetween.

17. The combination of claim 15, wherein the structured surface is separated from the major coupling surface by a land portion having a thickness less than 50 micrometers, the land portion being bounded on one side by the major coupling surface and bounded on an opposite side by a plane that is parallel to the coupling surface and that intersects the structured surface at point(s) of the structured surface closest to the major coupling surface.

18. The combination of claim 17, wherein the land portion has a thickness less than 25 micrometers.

19. The combination of claim 18, wherein the land portion has a thickness less than 10 micrometers.

20. The combination of claim 15, wherein the self-emissive pixelated light source includes an optical coupling layer that planarizes the pixelated light source, and wherein the outer surface of the light source is an outer surface of the optical coupling layer.

21. The combination of claim 20, wherein the optical coupling layer has a refractive index of at least 1.4.

22. The combination of claim 15, wherein the pixelated light source comprises pixels that have at least one transverse dimension of less than 25 microns.

23. The combination of claim 15, wherein the light extraction elements have a pitch greater than 1 micron.

24. A method of enhancing the light output of a self-emissive pixelated light source without substantially blurring pixels of the light source, comprising:
    providing a self-emissive pixelated light source having an outer surface;
    providing an optical extraction film having a major coupling surface, the extraction film including:
        a flexible carrier film; and
        a first and a second layer carried by the carrier film, the first and second layers defining therebetween an embedded interface that forms a structured surface of light extraction elements;
        wherein the first layer is nanovoided and comprises a polymer binder, the first layer also having a refractive index less than 1.35 and less than that of the second layer; and
    attaching the major coupling surface of the extraction film to the outer surface of the self-emissive pixelated light source.

25. The method of claim 24, wherein the self-emissive pixelated light source includes an optical coupling layer that planarizes the pixelated light source, and wherein the outer surface of the light source is an outer surface of the optical coupling layer.

26. The method of claim 24, wherein the attaching is carried out such that a land portion is defined between the structured surface of the optical extraction film and the outer surface of the light source, the land portion being bounded on one side by the major coupling surface and bounded on an opposite side by a plane that is parallel to the coupling surface and that intersects the structured surface at point(s) of the structured surface closest to the major coupling surface.

27. The method of claim 26, wherein the land portion has a thickness less than 50 microns.

28. The method of claim 27, wherein the land portion has a thickness less than 25 microns.

29. The method of claim 26, wherein the land portion has a thickness less than 10 microns.

30. The method of claim 26, wherein the land portion is thinner than the carrier film.

\* \* \* \* \*